(12) United States Patent
Zhang et al.

(10) Patent No.: US 10,937,896 B2
(45) Date of Patent: Mar. 2, 2021

(54) DEVICE FOR COMPOUND SEMICONDUCTOR FIN STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Haiyang Zhang, Shanghai (CN); Yan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/447,818

(22) Filed: Jun. 20, 2019

(65) Prior Publication Data

US 2019/0305108 A1    Oct. 3, 2019

Related U.S. Application Data

(62) Division of application No. 15/473,164, filed on Mar. 29, 2017, now Pat. No. 10,374,065.

(30) Foreign Application Priority Data

Jun. 1, 2016   (CN) .......................... 201610379438.4

(51) Int. Cl.
*H01L 29/66* (2006.01)
*H01L 29/78* (2006.01)
(Continued)

(52) U.S. Cl.
CPC ...... *H01L 29/6681* (2013.01); *H01L 21/3065* (2013.01); *H01L 29/0649* (2013.01);
(Continued)

(58) Field of Classification Search
CPC ..... H01L 21/823431; H01L 21/823821; H01L 27/0924; H01L 27/0886; H01L 27/10826;
(Continued)

(56) References Cited

U.S. PATENT DOCUMENTS 6,713,356 B1    3/2004  Skotnicki et al.
6,894,337 B1 *  5/2005  Wang ................ H01L 29/66795
                                                257/302
(Continued)

FOREIGN PATENT DOCUMENTS

CN        105336587        2/2016

OTHER PUBLICATIONS

U.S. Appl. No. 15/473,164,Non Final Office Action, dated Jun. 26, 2018, 9 pages.
(Continued)

*Primary Examiner* — David A Zarneke
(74) *Attorney, Agent, or Firm* — Anova Law Group, PLLC

(57) ABSTRACT

A semiconductor device includes a substrate and a fin structure. The fin structure includes a first semiconductor layer on the substrate, and a stack of one or more semiconductor layer structures. Each of the semiconductor layer structures includes a first insulator layer and a second semiconductor layer on the first insulator layer, the first and second semiconductor layers having a same semiconductor compound.

19 Claims, 15 Drawing Sheets

(51) Int. Cl.
| | |
|---|---|
| *H01L 21/3065* | (2006.01) |
| *H01L 29/06* | (2006.01) |
| *H01L 29/10* | (2006.01) |
| *H01L 29/161* | (2006.01) |
| *H01L 29/20* | (2006.01) |
| *H01L 27/092* | (2006.01) |
| *H01L 21/84* | (2006.01) |
| *H01L 27/12* | (2006.01) |
| *H01L 27/108* | (2006.01) |
| *H01L 29/417* | (2006.01) |
| *H01L 21/8238* | (2006.01) |
| *H01L 27/088* | (2006.01) |
| *H01L 21/8234* | (2006.01) |

(52) U.S. Cl.
CPC ........ *H01L 29/1033* (2013.01); *H01L 29/161* (2013.01); *H01L 29/20* (2013.01); *H01L 29/6653* (2013.01); *H01L 29/66522* (2013.01); *H01L 29/66553* (2013.01); *H01L 29/66787* (2013.01); *H01L 29/785* (2013.01); *H01L 21/823431* (2013.01); *H01L 21/823821* (2013.01); *H01L 21/845* (2013.01); *H01L 27/0886* (2013.01); *H01L 27/0924* (2013.01); *H01L 27/10826* (2013.01); *H01L 27/10879* (2013.01); *H01L 27/1211* (2013.01); *H01L 29/41791* (2013.01); *H01L 29/66795* (2013.01); *H01L 29/7831* (2013.01); *H01L 29/7856* (2013.01)

(58) Field of Classification Search
CPC ......... H01L 27/10879; H01L 29/66795; H01L 29/7831; H01L 29/785; H01L 2029/7858
See application file for complete search history.

(56) References Cited

U.S. PATENT DOCUMENTS

| | | | |
|---|---|---|---|
| 7,396,726 B2 | 7/2008 | Oh et al. | |
| 7,485,520 B2 * | 2/2009 | Zhu | H01L 29/66795 257/E21.301 |
| 7,563,665 B2 * | 7/2009 | Kato | H01L 21/84 438/212 |
| 8,093,659 B2 * | 1/2012 | Nuttinck | H01L 29/66795 257/347 |
| 8,299,565 B2 | 10/2012 | Sekaric et al. | |
| 8,779,495 B2 * | 7/2014 | Happ | H01L 21/84 257/314 |
| 9,111,784 B2 | 8/2015 | Ching et al. | |
| 9,355,920 B2 * | 5/2016 | Holland | H01L 29/66795 |
| 9,570,609 B2 | 2/2017 | Obradovic et al. | |
| 9,601,576 B2 | 3/2017 | Lauer et al. | |
| 9,647,098 B2 | 5/2017 | Obradovic et al. | |
| 9,755,017 B1 * | 9/2017 | Guillorn | H01L 29/0673 |
| 9,755,055 B2 | 9/2017 | Saitoh et al. | |
| 9,847,391 B1 | 12/2017 | Zang et al. | |
| 9,859,380 B2 | 1/2018 | Lee et al. | |
| 9,929,266 B2 | 3/2018 | Balakrishnan et al. | |
| 10,002,969 B2 * | 6/2018 | Chen | H01L 29/165 |
| 10,374,065 B2 | 8/2019 | Zhang et al. | |
| 2006/0220134 A1 | 10/2006 | Huo et al. | |
| 2008/0237641 A1 | 10/2008 | Oh et al. | |
| 2010/0219479 A1 | 9/2010 | Nuttinck | |
| 2015/0364594 A1 * | 12/2015 | Mieno | H01L 29/78663 257/401 |
| 2016/0111495 A1 * | 4/2016 | Brand | H01L 29/42392 438/283 |
| 2016/0141288 A1 | 5/2016 | Weng et al. | |
| 2017/0155001 A1 | 6/2017 | Chen et al. | |
| 2017/0358457 A1 * | 12/2017 | Jang | H01L 29/7853 |
| 2018/0366375 A1 * | 12/2018 | Chen | H01L 27/092 |

OTHER PUBLICATIONS

U.S. Appl. No. 15/473,164, Non-Final Office Action, dated Nov. 29, 2018, 14 pages.
U.S. Appl. No. 15/473,164, Notice of Allowance, dated Mar. 20, 2019, 10 pages.
European Patent Application No. 17173727.3, Extended European Search Report, dated Oct. 5, 2017, 9 pages.
Chinese Application No. 201610379438.4, Office Action dated Mar. 16, 2020, 5 Pages.

* cited by examiner

DEVICE FOR COMPOUND SEMICONDUCTOR FIN STRUCTURE

CROSS-REFERENCES TO RELATED APPLICATIONS

The present application is a divisional of U.S. patent application Ser. No. 15/473,164, filed Mar. 29, 2017, which claims priority to Chinese Patent Application No. 201610379438.4, filed with the State Intellectual Property Office of People's Republic of China on Jun. 1, 2016, the contents of which are incorporated herein by reference in their entirety.

TECHNICAL FIELD

The present disclosure relates to integrated semiconductor devices, and more particularly to compound semiconductor device structures.

BACKGROUND OF THE INVENTION

With the advance in semiconductor technology, feature sizes of complementary metal oxide semiconductor (CMOS) devices can be scaled down to 14 nm technology node and below through incorporating high-k dielectrics in the gate stack, strain engineering techniques, pocket implants and material optimization processes. However, further scaling of planar devices presents a significant challenge due to degrading short channel effects, process variations and reliability degradation.

The technological advance of FinFET devices enables further feature size reduction of CMOS devices beyond the 14 nm node. Through a fully depleted fin, short channel effect can be controlled, random doping fluctuation can be reduced, parasitic junction capacitance can be reduced, and area efficiency can be improved.

BRIEF SUMMARY OF THE INVENTION

Embodiments of the present disclosure provide methods for manufacturing a semiconductor device and semiconductor devices manufactured by the provided methods.

According to some embodiments of the present disclosure, a method of manufacturing a semiconductor device includes providing a substrate, forming a first semiconductor layer on the substrate, forming a stack of one or more semiconductor layer structures on the first semiconductor layer, each of the semiconductor layer structures including a first insulator layer and a second semiconductor layer on the first insulator layer, the first and second semiconductor layers having a same semiconductor compound, and performing an etching process on the stack of one or more semiconductor layer structures and the first semiconductor layer to form a fin structure.

In an embodiment, each of the semiconductor layer structures further includes a third semiconductor layer below the first insulator layer, so that the first insulator layer is between the third semiconductor layer and the second semiconductor layer, the second and third semiconductor layers having at least a common compound element. The second and third semiconductor layers each comprise a group III-V compound.

In an embodiment, the second semiconductor layer includes three compound elements, and the third semiconductor layer includes two compound elements. The third semiconductor layer includes InP.

In an embodiment, the method may further include forming a fourth semiconductor layer on the substrate, and the first semiconductor layer is formed on the fourth semiconductor layer. The fourth semiconductor layer includes InAlAs.

In an embodiment, the method may further include forming a high-k dielectric layer on the substrate, wherein the first semiconductor layer is formed on the high-k dielectric layer.

In an embodiment, the first semiconductor layer includes InGaAs, the second semiconductor layer includes InGaAs, and the first insulator layer includes a high-k dielectric material. The high-k dielectric material includes $HfO_2$.

In an embodiment, performing the etching process includes removing a portion of the fin structure to form a trench on opposite sides of the fin structure, and filling the trench with a second insulator layer.

Embodiments of the present disclosure also provide another method of manufacturing a semiconductor device. The method includes providing a substrate, forming a first semiconductor layer on the substrate, forming a stack of one or more semiconductor layer structures on the first semiconductor layer, each of the semiconductor layer structures comprising a second semiconductor layer and a third semiconductor layer on the a second semiconductor layer, the second and third semiconductor layers having at least a common compound element, and the third semiconductor layer and the first semiconductor layer having a same semiconductor compound. The method also includes performing an etching process on the stack of one or more semiconductor layer structures and the first semiconductor layer to form a fin structure, performing a selective etching process on the second semiconductor layer to form a first air gap between the first semiconductor layer and the third semiconductor layer and a second air gap between each of adjacent third semiconductor layers in the stack of one or more semiconductor layer structures, and filling the first and second air gaps with an insulator layer.

In an embodiment, the method further includes, prior to performing the etching process on the stack of one or more semiconductor layer structures and the first semiconductor layer to form the fin structure, etching the second semiconductor layer in each of the one or more semiconductor layer structures, and performing the selective etching process includes removing a portion of the second semiconductor layer in each of the one or more semiconductor layer structures.

In an embodiment, the method further includes forming a fourth semiconductor layer on the substrate, and the first semiconductor layer is formed on the fourth semiconductor layer.

In an embodiment, the substrate includes silicon, the first semiconductor layer includes germanium tin, the second semiconductor layer includes germanium, the third semiconductor layer includes germanium tin, and the insulator layer includes silicon oxide.

Embodiments of the present disclosure also provide a semiconductor device manufactured based on one of the above-described methods. The semiconductor device includes a substrate, and a fin structure. The fin structure includes a first semiconductor layer on the substrate, and a stack of one or more semiconductor layer structures, each of the semiconductor layer structures including a first insulator layer and a second semiconductor layer on the first insulator layer, and the first and second semiconductor layers have the same semiconductor compound.

In an embodiment, each of the semiconductor layer structures further includes a third semiconductor layer below the first insulator layer, so that the first insulator layer is between the third semiconductor layer and the second semiconductor layer, the third semiconductor layer and the second semiconductor layer have at least a common compound element.

In an embodiment, the third semiconductor layer comprises InP. The third semiconductor layer and the second semiconductor layer each include a group III-V compound.

In an embodiment, the second semiconductor layer includes three compound elements, and the third semiconductor layer includes two compound elements.

In an embodiment, the substrate includes a fourth semiconductor layer, and the first semiconductor layer is on the fourth semiconductor layer.

In an embodiment, the substrate includes a high-k dielectric layer, and the first semiconductor layer is on the high-k dielectric layer. In an embodiment, the first semiconductor layer includes InGaAs, the second semiconductor layer includes InGaAs, and the first insulator layer includes a high-k dielectric material. The high-k dielectric material includes $HfO_2$, and the fourth semiconductor layer includes InAlAs.

Embodiments of the resent disclosure also provide another semiconductor device manufactured by a different method. The semiconductor device includes a substrate, and a fin structure. The fin structure may include a first semiconductor layer on the substrate, and a stack of one or more semiconductor layer structures, each of the semiconductor layer structures including an insulator layer and a third semiconductor layer on the first insulator layer, the first and third semiconductor layers having a same semiconductor compound.

In an embodiment, the substrate includes a fourth semiconductor layer, and the first semiconductor layer is on the fourth semiconductor layer.

In an embodiment, the first semiconductor layer includes germanium tin, the third semiconductor layer includes germanium tin, and the insulator layer includes silicon oxide.

The following detailed description together with the accompanying drawings will provide a better understanding of the nature and advantages of the present disclosure.

DETAILED DESCRIPTION OF THE INVENTION

Figure 1:
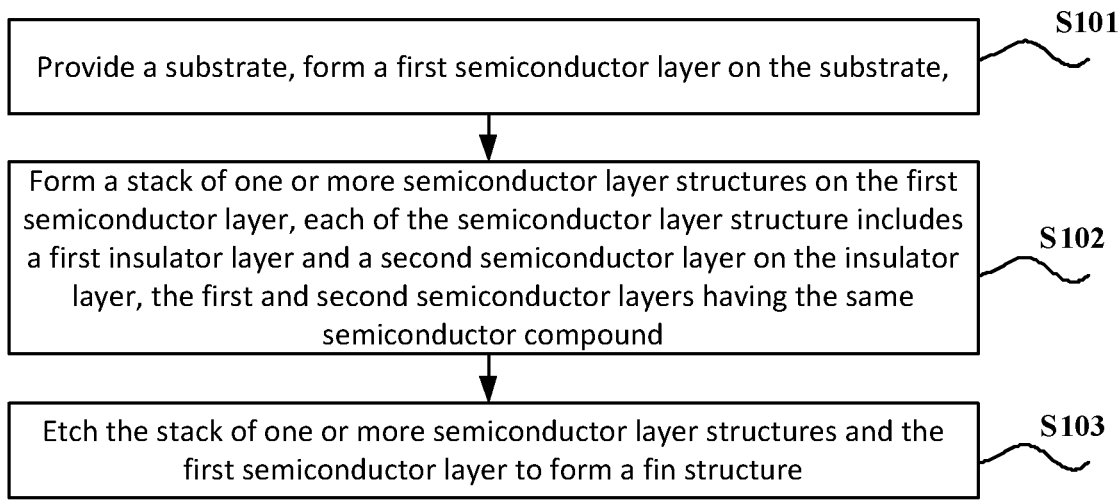
FIG. 1 is a flowchart of a method for manufacturing a semiconductor device according to an embodiment of the present disclosure.

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" or "bottom" and "top" may be used herein to describe a relationship of one element, layer or region to another element, layer or region as illustrated in the figures. It will be understood that these terms are intended to encompass different orientations of the device in addition to the orientation depicted in the figures.

The use of the terms "first", "second", "third", etc. do not denote any order, but rather the terms first, second, third etc. are used to distinguish one element from another. Furthermore, the use of the terms "a", "an", etc. does not denote a limitation of quantity, but rather denote the presence of at least one of the referenced items.

The terminology used herein is for the purpose of describing particular embodiments only and is not intended to be limiting of the disclosure. As used herein, the singular forms "a", "an", and the are intended to include the plural forms as well, unless the context clearly indicates otherwise. It will be further understood that the terms "comprises", "comprising", "having", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

FIG. 1 is a flowchart of a method for manufacturing a semiconductor device according to an embodiment of the present disclosure. FIG. 2A through FIG. 2D are cross-sectional views illustrating intermediate stages of a semiconductor structure in different process steps of a method of manufacturing according to an embodiment of the present disclosure.

Referring to FIG. 1, the method may include providing a substrate and forming a first semiconductor layer on the substrate in step S101.

Figure 2A:
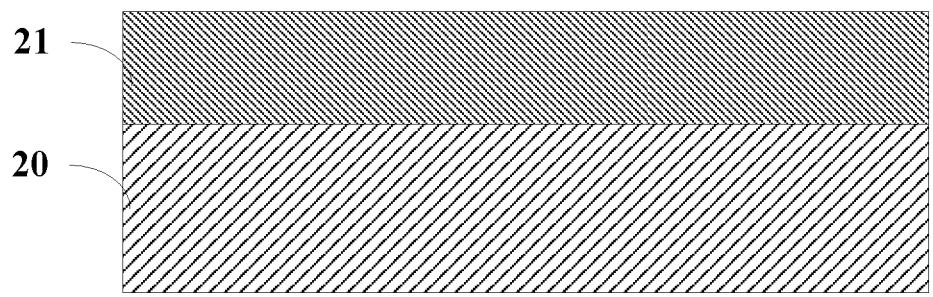
FIG. 2A is a cross-sectional view illustrating an intermediate stage in the manufacturing process of a semiconductor structure according to one embodiment of the present disclosure.

FIG. 2A is a cross-sectional view illustrating an intermediate stage of a semiconductor structure in step S101 according to an embodiment of the present disclosure. As shown in FIG. 2A, a first semiconductor layer 21 is formed on a semiconductor substrate 20 (e.g., silicon). In an embodiment, first semiconductor layer 21 may include InGaAs (indium gallium arsenide compound). In an embodiment, first semiconductor layer 21 may have a thickness in the range between 100 Å and 1000 Å, e.g., 300 Å, 500 Å, or 800 Å.

In an embodiment, the semiconductor substrate may include four semiconductor layers formed on semiconductor substrate 20, and the first semiconductor layer is formed on the four semiconductor layers.

In an embodiment, the semiconductor substrate may include a high-k dielectric layer (not shown) formed on semiconductor substrate 20, and the first semiconductor layer is formed on the high-k dielectric layer.

Referring back to FIG. 1, in step S102, a stack of one or more semiconductor layer structures is formed on the first semiconductor layer.

Figure 2B:
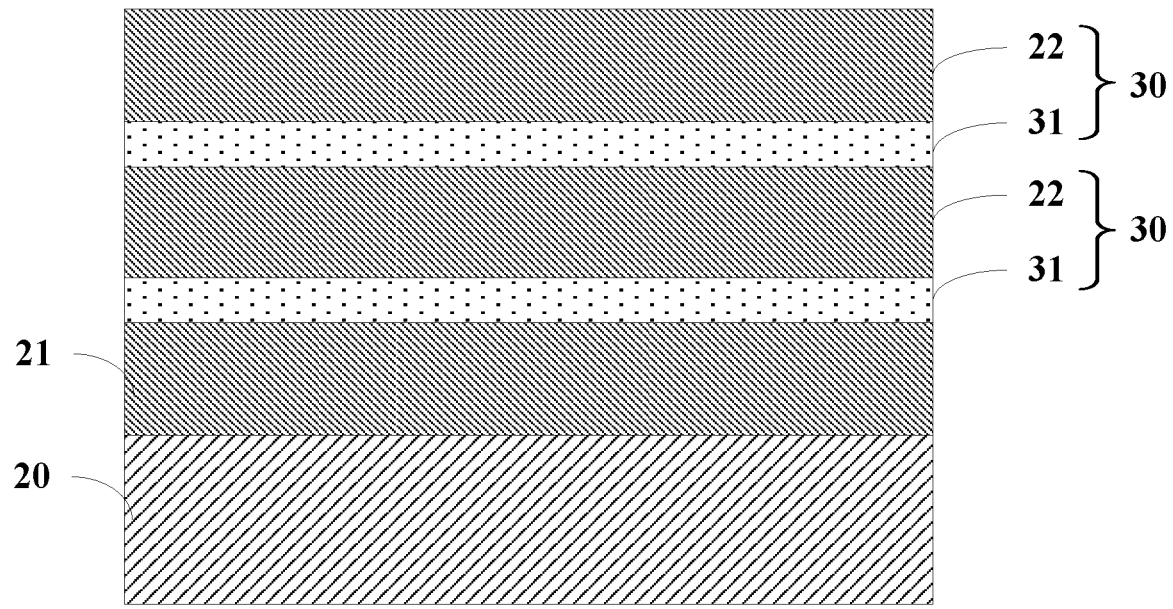
FIG. 2B is a cross-sectional view illustrating an intermediate stage in the manufacturing process of a semiconductor structure according to one embodiment of the present disclosure.

FIG. 2B is a cross-sectional view illustrating an intermediate stage of a semiconductor structure in step S102 according to an embodiment of the present disclosure. As shown in FIG. 2B, a stack of one or more semiconductor layer structures 30 is formed on first semiconductor layer 21. Semiconductor layer structure 30 may include a first insulator layer 31 and a second semiconductor layer 22 on first insulator layer 31. First semiconductor layer 21 includes the same semiconductor compound as that of second semiconductor layer 22.

It is understood that the term "semiconductor compound" used herein refers to a semiconductor compound that includes main elements from different groups of the periodic table for forming the semiconductor layer, but does not include impurity elements that may affect the conductivity type of the semiconductor layer.

In an embodiment, second semiconductor layer 22 includes a group III-V compound. In an embodiment, second semiconductor layer 22 may include three compound elements, e.g., InGaAs. In an embodiment, second semiconductor layer 22 may have a thickness in the range between 100 Å and 1000 Å, e.g., 300 Å, 500 Å, or 800 Å.

In an embodiment, first insulator layer 31 may include a high-k dielectric material, e.g., $HfO_2$. For example, the high-k dielectric material may include zirconium dioxide or titanium dioxide. In an embodiment, first insulator layer 31 may have a thickness in the range between 5 Å and 50 Å, e.g., 10 Å, or 30 Å.

It is understood that the number of semiconductor layer structures 30 can be any integer number N. In the example shown in FIG. 2B, two semiconductor layer structures 30 are formed on first semiconductor layer 21. But it is understood that the number is arbitrary chosen for describing the example embodiment and should not be limiting.

In an embodiment, first insulator layer 31 may be formed on first semiconductor layer 21 using a deposition process. In an embodiment, second semiconductor layer 22 may be formed on first insulator layer 31 using a deposition or sputtering process. In an embodiment, first insulator layer 31 may be formed on second semiconductor layer 22 using a deposition process. Second semiconductor layer 22 and first insulator layer 31 may then be alternately formed in this order to form subsequent semiconductor layer structures.

Referring back to FIG. 1, in step S103, a etch process is performed on the stack of one or more semiconductor layer structures and the first semiconductor layer to form a fin structure.

Figure 2C:
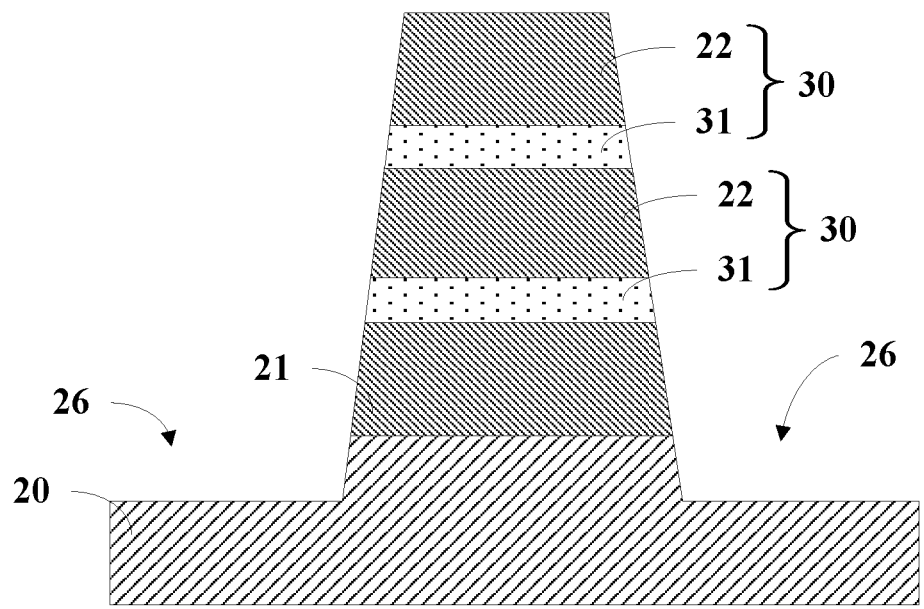
FIG. 2C is a cross-sectional view illustrating an intermediate stage in the manufacturing process of a semiconductor structure according to one embodiment of the present disclosure.

FIG. 2C is a cross-sectional view illustrating an intermediate stage of a semiconductor structure in step S103 according to an embodiment of the present disclosure. As shown in FIG. 2C, a portion of the stack of one or more semiconductor layer structures 30 and a portion first semiconductor layer 21 are removed by etching to form a fin structure. A portion of the substrate (e.g., semiconductor substrate 20) is also removed by the etching process, as shown in FIG. 2C.

In an embodiment, performing the etching process includes forming a first patterned mask layer, e.g., photoresist (not shown) on the structure shown in FIG. 2B. In an embodiment, performing the etching process may also include removing a portion of the structure in FIG. 2B using the first patterned mask layer as a mask to form the fin structure. In an embodiment, the first patterned mask layer is then removed after forming the fin structure.

Thus, a method of manufacturing a semiconductor device according to an embodiment of the present disclosure is provided.

Figure 2D:
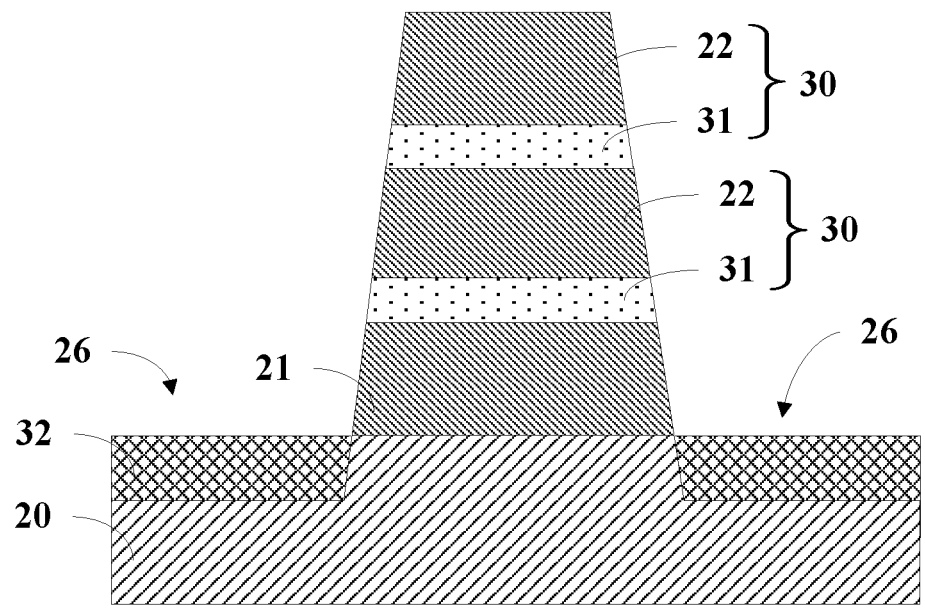
FIG. 2D is a cross-sectional view illustrating an intermediate stage in the manufacturing process of a semiconductor structure according to one embodiment of the present disclosure.

In an embodiment, referring to FIG. 2C, a trench 26 is formed on opposite sides of the fin structure using the above-described etching process. In an embodiment, the method may further include partially filling trench 26 with a second insulator layer 32, as shown in FIG. 2D. For example, second insulator material 32 may include silicon dioxide.

In an embodiment, the step of partially filling the trench may include depositing the second insulator layer to completely fill trench 26, and then performing an etching process on second insulator layer 32 to remove a portion of the second insulator layer, so that second insulator layer 32 partially fills trench 26.

In another embodiment, the step of forming the fin structure and the second insulator layer may include forming a patterned hardmask layer (e.g., silicon nitride) on the structure shown in FIG. 2B. In an embodiment, the step of forming the fin structure and the second insulator layer may also include performing an etching process on the semiconductor layer structure and the first semiconductor layer using the hardmask layer as a mask to obtain the fin structure including the trench. In an embodiment, the step of forming the fin structure and the second insulator layer may also include forming the second insulator layer to fill the trench and cover the hardmask layer using a deposition process. In an embodiment, the step may also include planarizing (e.g., using a chemical mechanical polishing process) the second insulator layer to expose a surface of the hardmask layer, and removing the hardmask layer using a wet etch process (e.g., using hot phosphoric acid). In an embodiment, the step may also include performing an etching process on the second insulator layer to remove a portion of the second insulator layer, so that the second insulator layer partially fills the trench.

A semiconductor device is provided by the above-described method of the present disclosure. Referring to FIG. 2D, a semiconductor device may include a substrate (e.g., semiconductor substrate 20 including silicon) and a fin structure on the substrate.

In an embodiment, the fin structure includes a first semiconductor layer 21 on the substrate, and a stack of one or more semiconductor layer structures 30 on first semiconductor layer 21. Semiconductor layer structure 30 may include a first insulator layer 31 and a second semiconductor layer 22 on first insulator layer 31. First semiconductor layer 21 includes the same semiconductor compound as that of second semiconductor layer 22.

In an embodiment, first semiconductor layer 21 includes InGaAs and has a thickness in the range between 100 Å and 1000 Å, e.g., 300 Å, 500 Å, or 800 Å, etc.

In an embodiment, second semiconductor layer 22 includes a group III-V compound. In an embodiment, second semiconductor layer 22 may include three compound elements, e.g., InGaAs. In an embodiment, second semiconductor layer 22 may have a thickness in the range between 100 Å and 1000 Å, e.g., 300 Å, 500 Å, or 800 Å, etc.

In an embodiment, first insulator layer 31 may include a high-k dielectric material, e.g., HfO$_2$. For example, the high-k dielectric material may include titanium dioxide. In an embodiment, first insulator layer 31 may have a thickness in the range between 5 Å and 50 Å, e.g., 10 Å, or 30 Å.

In an embodiment, the substrate may also include a fourth semiconductor layer, and the first semiconductor layer is formed on the fourth semiconductor layer.

In an embodiment, the substrate may also include a high-k dielectric layer, and the first semiconductor layer is formed on the high-k dielectric layer.

In an embodiment, referring to FIG. 2D, the fin structure has a trench 26 on opposite sides thereof. The semiconductor device may include a second semiconductor layer 32 (e.g., silicon oxide) partially filling trench 26.

In a semiconductor device according to some embodiments of the present disclosure, a source and a drain may be formed in second semiconductor layer (e.g. InGaAs) 22, and a gate may be formed on the fin structure to form an NMOS device or a PMOS device, where a portion of the second semiconductor layer between the source and the drain may serve as a channel region. Comparing with conventional fin structures without the insulator layers, the fin structure of the present disclosure includes one or more insulator layers (e.g., first insulator layer 31) to achieve a higher ratio of an on-current to an off-current (On current/Off current ratio), thereby improving the device performance.

FIG. 3A through FIG. 3D are cross-sectional views illustrating intermediate stages of a semiconductor structure in different process steps of a method of manufacturing according to another embodiment of the present disclosure.

Figure 3A:
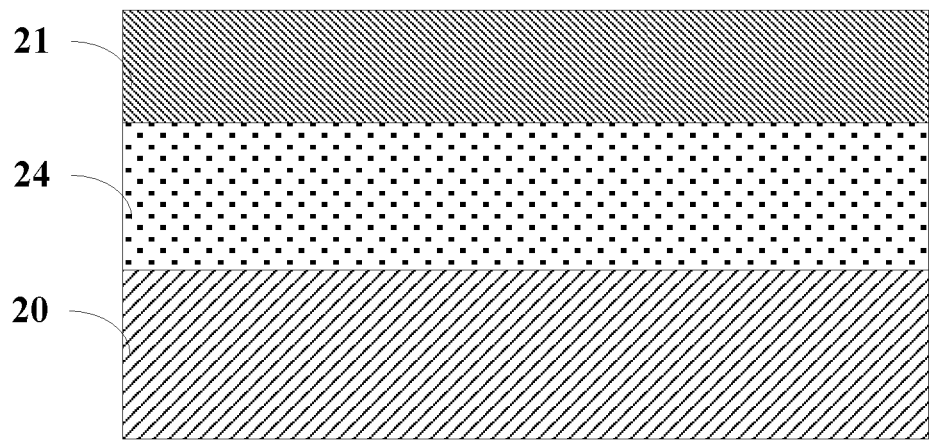
FIG. 3A is a cross-sectional view illustrating an intermediate stage in the manufacturing process of a semiconductor structure according to another embodiment of the present disclosure.

First, referring to FIG. 3A, a first semiconductor layer (e.g., InGaAs) 21 is formed on a substrate, which includes a semiconductor substrate (e.g., semiconductor substrate) 20 and a fourth semiconductor layer (e.g., InAlAs) 24. In an embodiment, fourth semiconductor layer 24 includes InAlAs and has a thickness in the range between 100 Å and 1000 Å, e.g., 300 Å, 500 Å, or 800 Å, etc.

Figure 3B:
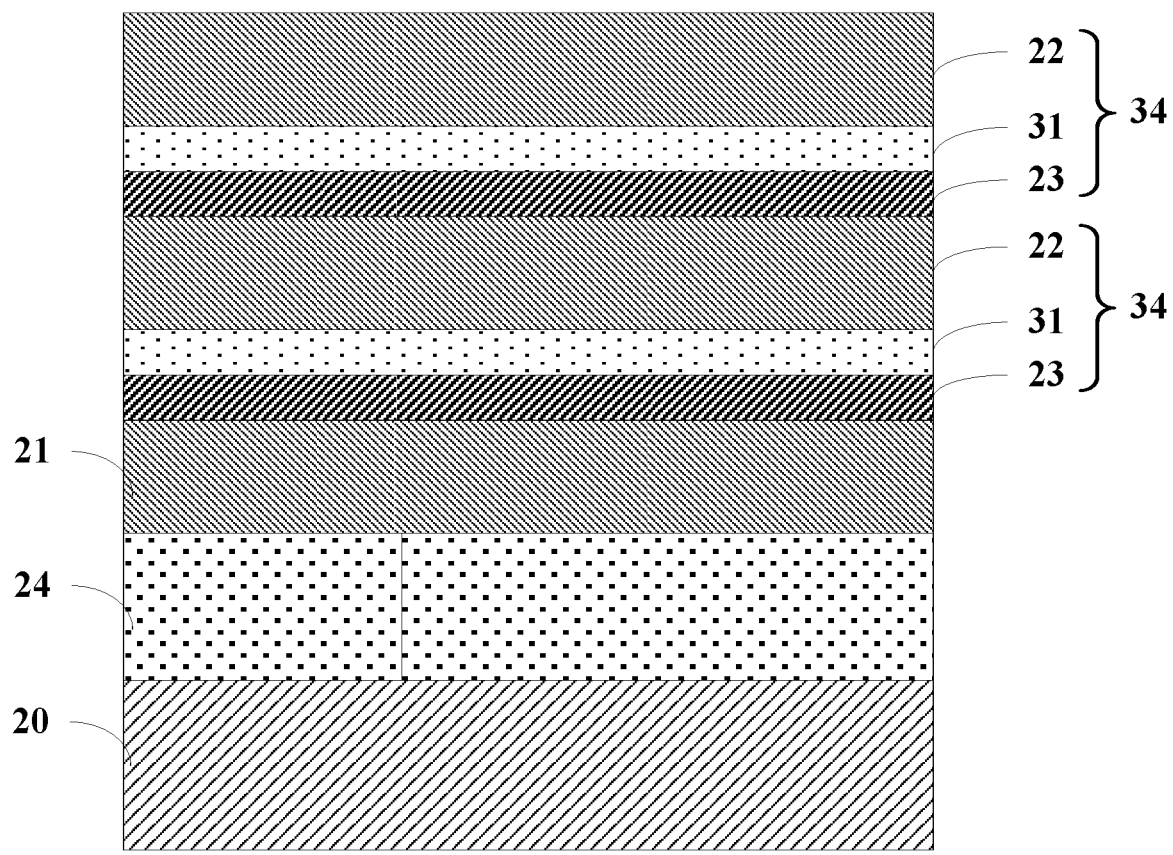
FIG. 3B is a cross-sectional view illustrating an intermediate stage in the manufacturing process of a semiconductor structure according to another embodiment of the present disclosure.

Next, referring to FIG. 3B, a stack of one or more semiconductor layer structures 34 are formed on first semiconductor layer 21. Semiconductor layer structure 34 includes a first insulator (e.g., high-k dielectric) layer 31 and a second semiconductor layer (e.g., InGaAs) 22 on first insulator layer 31. First semiconductor layer 21 includes the same semiconductor compound as that of second semiconductor layer 22.

In an embodiment, semiconductor layer structure 34 may also include a third semiconductor layer 23 below first insulator layer 31, so that first insulator layer 31 is disposed between third semiconductor layer 23 and second semiconductor layer 22, as shown in FIG. 3B. Third semiconductor layer 23 and second semiconductor layer 22 include at least a common compound element. In an embodiment, third semiconductor layer 23 includes a group III-V compound. In an embodiment, third insulator layer 23 may include two compound elements, e.g., indium phosphide (InP). In an embodiment, third semiconductor layer 23 has a thickness in the range between 5 Å and 50 Å, e.g., 10 Å, 20 Å, or 40 Å.

In an embodiment, third semiconductor layer 23 may be formed on first semiconductor layer 21 using a molecular beam epitaxy (MBE) or a metal organic chemical vapor deposition (MOCVD) process. In an embodiment, first insulator layer 31 is formed on third semiconductor layer 23 using a deposition process. In an embodiment, second semiconductor layer 22 is formed on first insulator layer 31 using a deposition or sputtering process. In an embodiment, third semiconductor layer 23 of a next semiconductor layer structure 34 is formed on second semiconductor layer 22 of the semiconductor layer structure below using an MBE or MOCVD process.

Figure 3C:
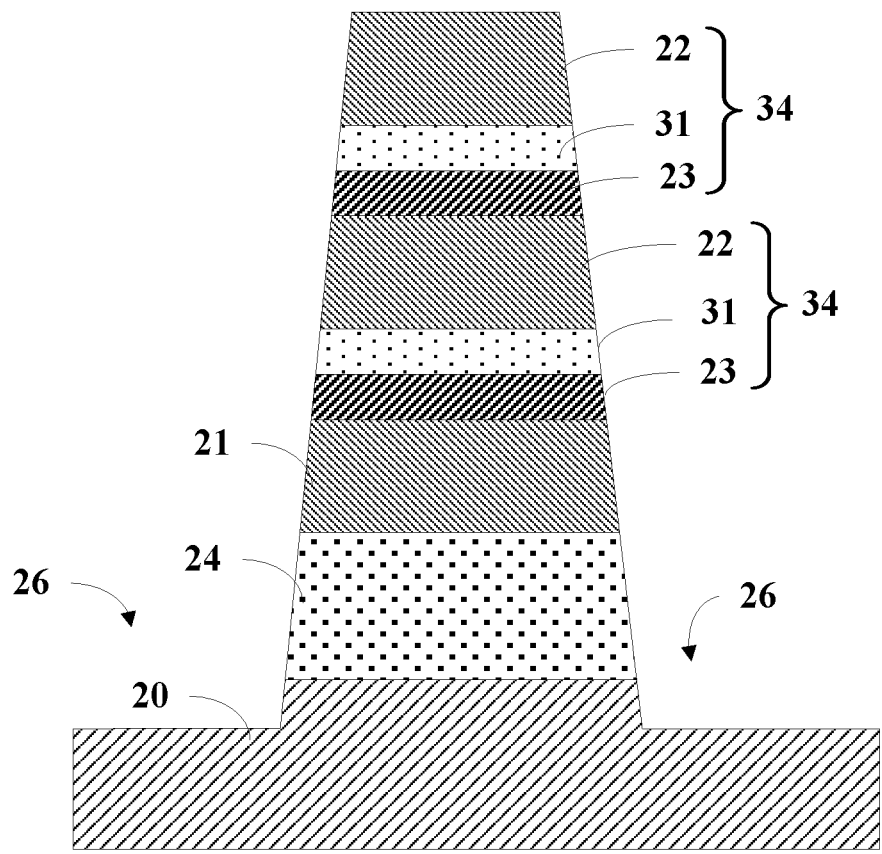
FIG. 3C is a cross-sectional view illustrating an intermediate stage in the manufacturing process of a semiconductor structure according to another embodiment of the present disclosure.

Next, referring to FIG. 3C, an etching process is performed on the stack of one or more semiconductor layer structures 34, first semiconductor layer 21 and fourth semiconductor layer 24 to form a fin structure. The etching process forms a trench 26 on opposite sides of the fin structure. In an embodiment, the etching process also removes a portion of semiconductor substrate 20, as shown in FIG. 3C.

Figure 3D:
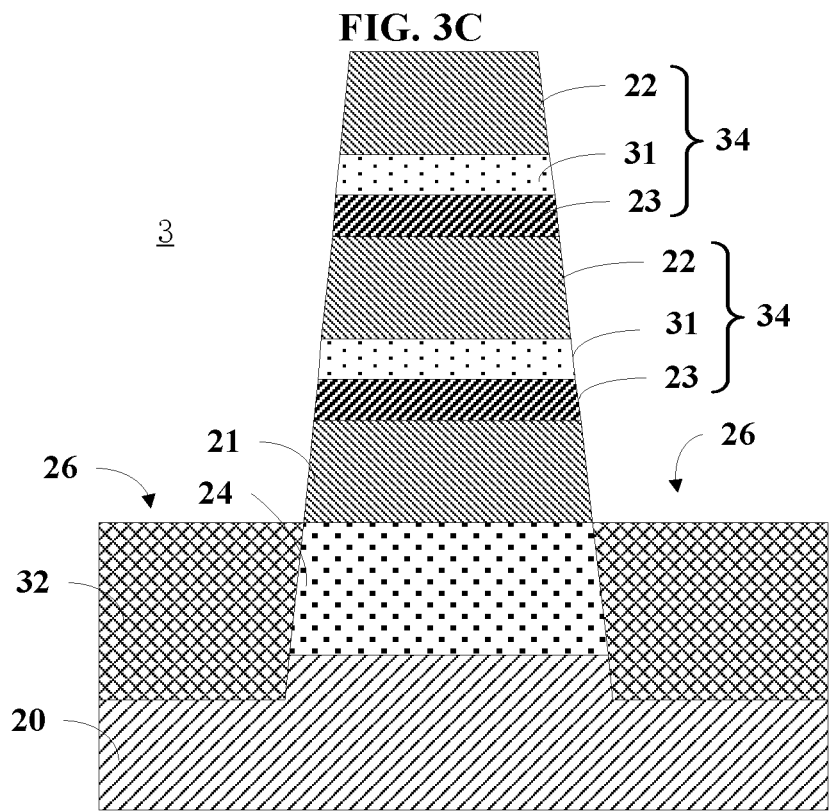
FIG. 3D is a cross-sectional view illustrating an intermediate stage in the manufacturing process of a semiconductor structure according to another embodiment of the present disclosure.

Next, referring to FIG. 3D, trench 26 is filled with a second insulator layer 32.

Thus, the method of the present disclosure provides a semiconductor device 3. Referring to FIG. 3D, semiconductor device 3 includes a substrate and a fin structure on the substrate. The substrate may include a semiconductor substrate (e.g., silicon substrate) 20 and a fourth semiconductor layer (e.g., InAlAs) 24 on semiconductor substrate 20. In an embodiment, fourth semiconductor layer 24 includes InAlAs and has a thickness in the range between 100 Å and 1000 Å, e.g., 300 Å, 500 Å, or 800 Å.

In an embodiment, referring still to FIG. 3D, the fin structure may include a first semiconductor layer (e.g., InGaAs) 21 on the substrate, a stack of one or more semiconductor layer structures 34 on first semiconductor layer 21. Semiconductor layer structure 34 includes a first insulator layer (e.g., high-k dielectric) 31 and a second semiconductor layer (e.g., InGaAs) 22 on first insulator layer 31. First semiconductor layer 21 includes the same semiconductor compound as that of second semiconductor layer 22. In an embodiment, semiconductor layer structure 34 also includes a third semiconductor layer 23 below first insulator layer 31, so that first insulator layer 31 is disposed between third semiconductor layer 23 and second semiconductor layer 22. Third semiconductor layer 23 and second semiconductor layer 22 have at least a common compound element.

In an embodiment, third semiconductor layer 23 includes a group III-V compound. In an embodiment, third semiconductor layer 23 may include two compound elements, e.g., indium phosphide (InP). In an embodiment, third semiconductor layer 23 has a thickness in the range between 5 Å and 50 Å, e.g., 10 Å, 20 Å, or 40 Å.

In an embodiment, referring still to FIG. 3D, a trench 26 is disposed on opposite sides of the fin structure. The semiconductor device further includes a second insulator layer 32 partially filling trench 26.

Embodiments of the present disclosure also provide a semiconductor device having a source and a drain in second semiconductor layer 22 and a gate on the fin structure to form an NMOS device or a PMOS device, where a portion of second semiconductor layer 22 between the source and the drain forms a channel region. Comparing with conventional fin structures without the insulator layers, the fin structure of the present disclosure includes one or more insulator layers (e.g., first insulator layer 31) to achieve a higher On current/Off current ratio, thereby improving the device performance.

In an embodiment, the second and third semiconductor layers each include a group III-V compound. For example, the second semiconductor layer includes InGaAs, and the third semiconductor layer includes InP. The structure reduces the stress at the top portion of the fin structure and the group III-V compound has a relatively high mobility, which can improve the electrical properties of the device.

Figure 4:
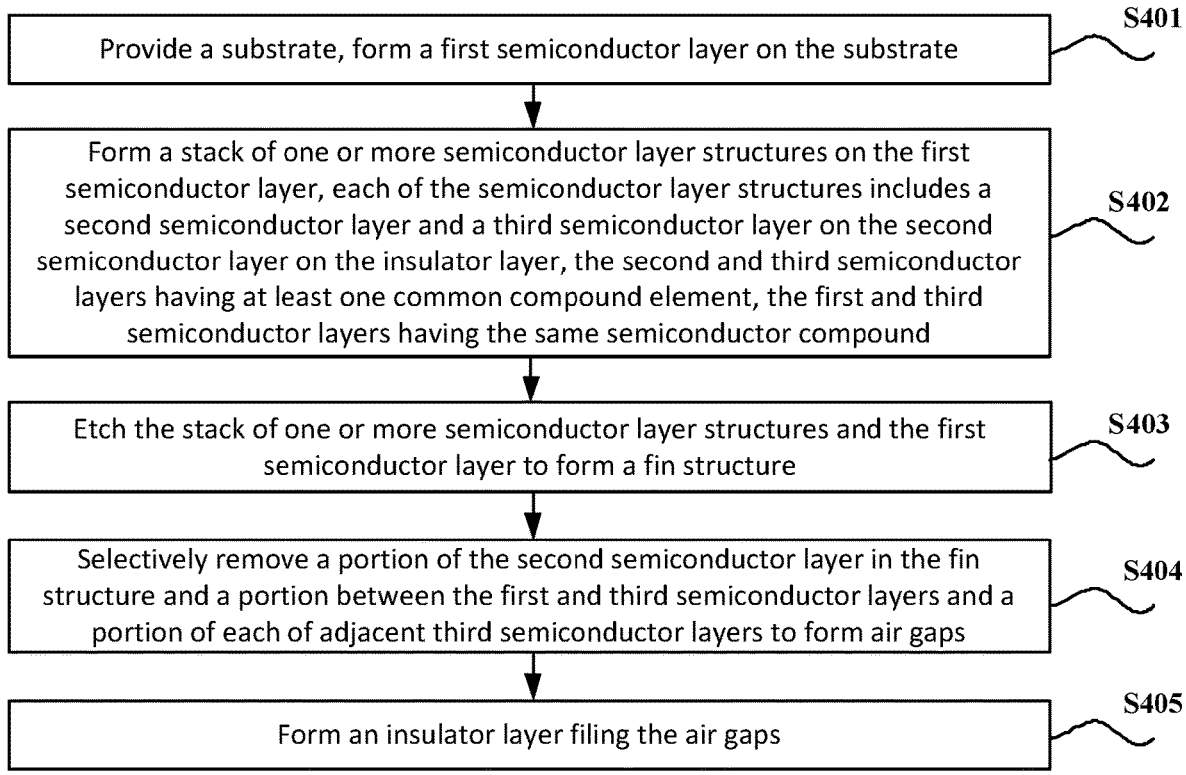
FIG. 4 is a flowchart of a method for manufacturing a semiconductor device according to another embodiment of the present disclosure.

FIG. 4 is a flowchart of a method for manufacturing a semiconductor device according to another embodiment of the present disclosure. FIGS. 5A, 5B, 6A, 6B, 7A, 7B, 8A, 8B, 9A, and 9B are cross-sectional views illustrating intermediate stages of a semiconductor structure in different process steps of a method of manufacturing according to another embodiment of the present disclosure.

Referring to FIG. 4, in step S401, the method may include providing a substrate and forming a first semiconductor layer on the substrate.

Figure 5A:
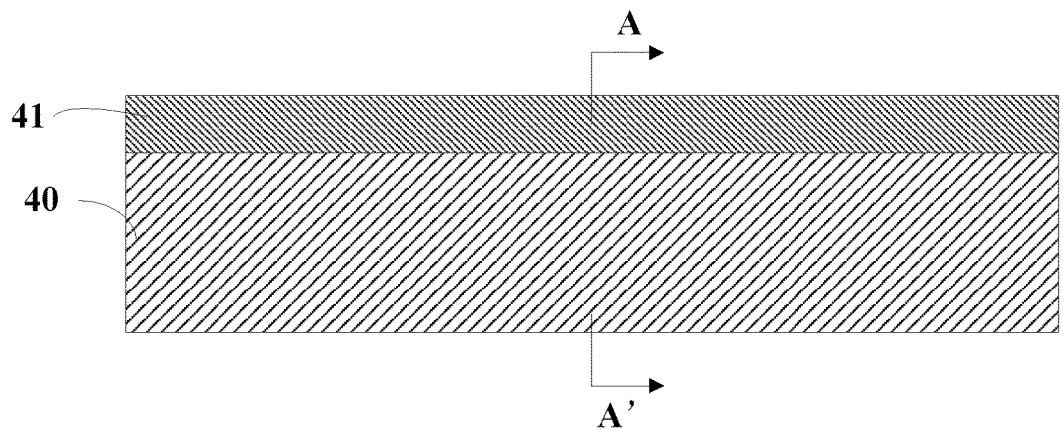
FIG. 5A is a cross-sectional view illustrating an intermediate stage in the manufacturing process of a semiconductor structure taken along the longitudinal direction according to yet another embodiment of the present disclosure.
Figure 5B:
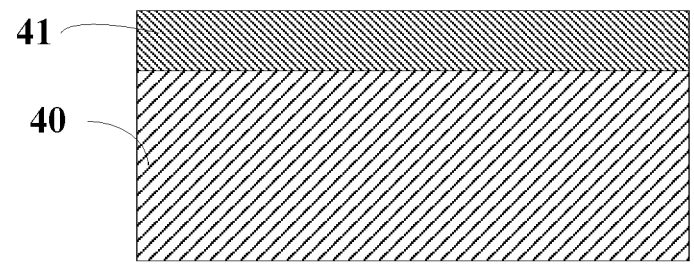
FIG. 5B is a cross-sectional view illustrating an intermediate stage of the semiconductor structure in FIG. 5A taken along the line A-A' in the traverse direction (perpendicular to the longitudinal direction).

FIG. 5A is a cross-sectional view illustrating an intermediate stage of a semiconductor structure in step S401 along the longitudinal direction according to an embodiment of the present disclosure. FIG. 5B is a cross-sectional view illustrating an intermediate stage of the semiconductor structure in FIG. 5A taken along line A-A' in the traverse direction (perpendicular to the longitudinal direction) of FIG. 5A. As shown in FIG. 5A and FIG. 5B, a first semiconductor layer 41 is formed on a semiconductor substrate 40. The semiconductor substrate may include silicon, e.g., undoped silicon or boron doped silicon. For example, boron doped silicon may have a better etch selectivity than undoped silicon, i.e., the etch rate of boron doped silicon is slower than the etch rate of undoped silicon. In an embodiment, first silicon layer 41 includes germanium tin compound ($Ge_{1-x}Sn_x$). In an embodiment, first silicon layer 41 has a thickness in the range between 5 nm and 50 nm, e.g., 10 nm, 30 nm, etc.

In an embodiment, the substrate may include a fourth semiconductor layer on semiconductor substrate 40 (not shown), and first semiconductor layer 41 is on the fourth semiconductor layer.

Referring back to FIG. 4, in step S402, the method may include forming a stack of one or more semiconductor layer structures.

Figure 6A:
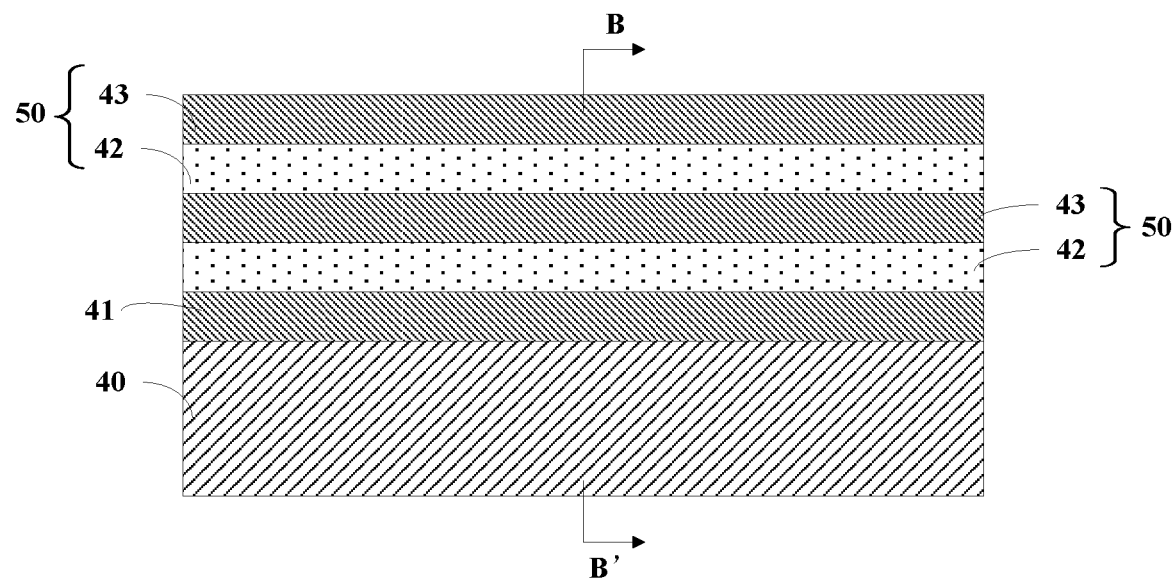
FIG. 6A is a cross-sectional view illustrating an intermediate stage in the manufacturing process of a semiconductor structure taken along the longitudinal direction according to yet another embodiment of the present disclosure.
Figure 6B:
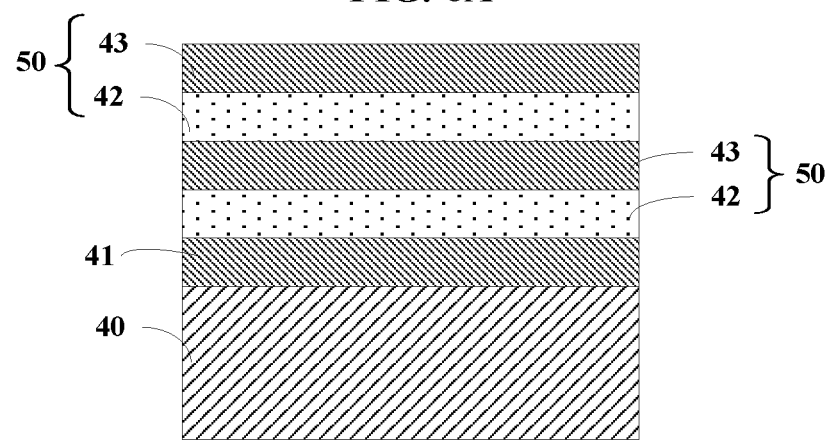
FIG. 6B is a cross-sectional view illustrating an intermediate stage of the semiconductor structure in FIG. 6A taken along the line B-B' in the traverse direction.

FIG. 6A is a cross-sectional view illustrating an intermediate stage of a semiconductor structure in step S402 along the longitudinal direction according to an embodiment of the present disclosure. FIG. 6B is a cross-sectional view illustrating an intermediate stage of the semiconductor structure in FIG. 6A taken along line B-B' in the traverse direction of FIG. 6A. As shown in FIG. 6A and FIG. 6B, a stack of one or more semiconductor layer structures 50 is formed on first semiconductor layer 41. Semiconductor layer structure 50 includes a second semiconductor layer 42 and a third semiconductor layer 43 on second semiconductor layer 42. Second semiconductor layer 42 and third semiconductor layer 43 may include at least a common compound element. First semiconductor layer 41 and third semiconductor layer 43 have the same semiconductor compound.

In an embodiment, second semiconductor layer 42 includes germanium (Ge) and has a thickness in the range between 5 nm and 50 nm, e.g., 10 nm, 30 nm, etc.

In an embodiment, second semiconductor layer 42 includes a germanium tin compound and has a thickness in the range between 5 nm and 50 nm, e.g., 10 nm, 30 nm, etc.

It is understood that the number of semiconductor layer structures 50 can be any integer number N. In the example shown in FIG. 6A and FIG. 6B, two semiconductor layer structures 50 are formed on first semiconductor layer 41. But it is understood that the number is arbitrary chosen for describing the example embodiment and should not be limiting.

In an embodiment, second semiconductor layer 42 may be formed on first semiconductor layer 41 using an epitaxial growth process. In an embodiment, third semiconductor layer 43 may be formed on second semiconductor layer 42 using an epitaxial growth process. In an embodiment, second semiconductor layer 42 of the next semiconductor layer structure may be formed on third semiconductor layer 43 of the current semiconductor layer structure using an epitaxial growth process.

Referring back to FIG. 4, in step S403, the method may include performing an etching process on the stack of one or more semiconductor structures and the first semiconductor layer to form a fin structure.

Figure 7A:
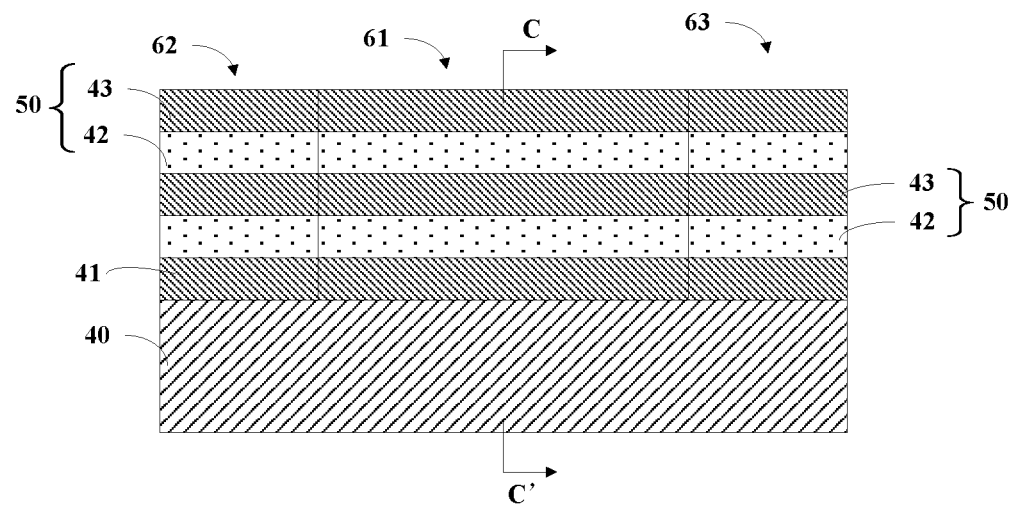
FIG. 7A is a cross-sectional view illustrating an intermediate stage in the manufacturing process of a semiconductor structure taken along the longitudinal direction according to yet another embodiment of the present disclosure.
Figure 7B:
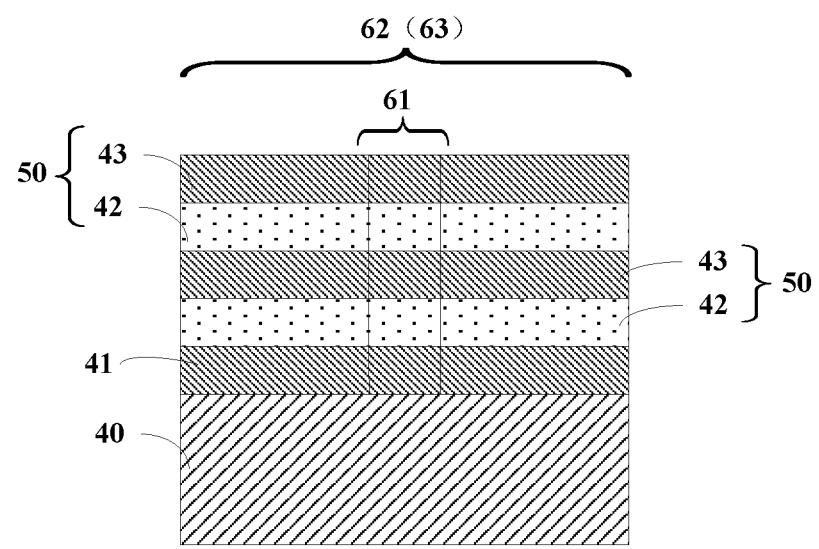
FIG. 7B is a cross-sectional view illustrating an intermediate stage of the semiconductor structure in FIG. 7A taken along the line C-C' in the traverse direction.

FIG. 7A is a cross-sectional view illustrating an intermediate stage of a semiconductor structure in step S403 along the longitudinal direction according to an embodiment of the present disclosure. FIG. 7B is a cross-sectional view illustrating an intermediate stage of the semiconductor structure in FIG. 7A taken along the line C-C' in the traverse direction of FIG. 7A. As shown in FIG. 7A and FIG. 7B, a portion of the stack of one or more semiconductor structures 50 and a portion of first semiconductor layer 41 are removed by etching to form a fin structure.

In an embodiment, as shown in FIG. 7A and FIG. 7B, the fin structure includes a first portion 61 disposed in the middle portion of the fin structure, a second portion 62, and a third portion 63 adjacent to opposite sides of first portion 61 along the longitudinal direction. In an embodiment, as shown in FIG. 7B, the dimension of first portion 61 is smaller than the dimension of second portion 62 and smaller than the dimension of third portion 63 in the transverse direction (perpendicular to the longitudinal direction).

In an embodiment, the step of performing the etching process on the stack of one or more semiconductor structures and the first semiconductor layer may include forming a second mask layer, e.g., photoresist (not shown) on semiconductor layer structures 50, and etching the stack of semiconductor layer structures 50 and first semiconductor layer 41 using the second mask layer as a mask to remove a portion of semiconductor layer structures 50 and a portion of first semiconductor layer 41 to form the fin structure. For example, the etching process may be performed using an interferometer endpoint (IEP) process based on chlorine gas ($Cl_2$) or an inductively coupled plasma (ICP) process. In an embodiment, after the etching process has been carried out, the method also includes removing the second mask layer.

Referring back to FIG. 4, in step S404, the method may include selectively removing the second semiconductor layer in the fin structure to form an air gap between the first semiconductor layer and the third semiconductor layer.

Figure 8A:
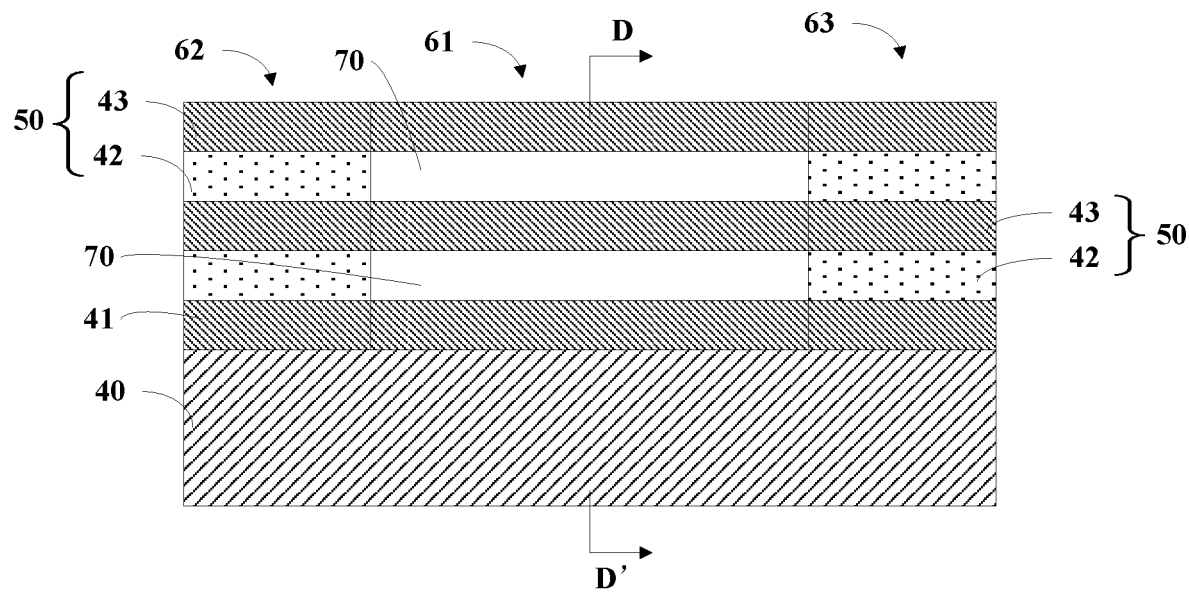
FIG. 8A is a cross-sectional view illustrating an intermediate stage in the manufacturing process of a semiconductor structure taken along the longitudinal direction according to yet another embodiment of the present disclosure.
Figure 8B:
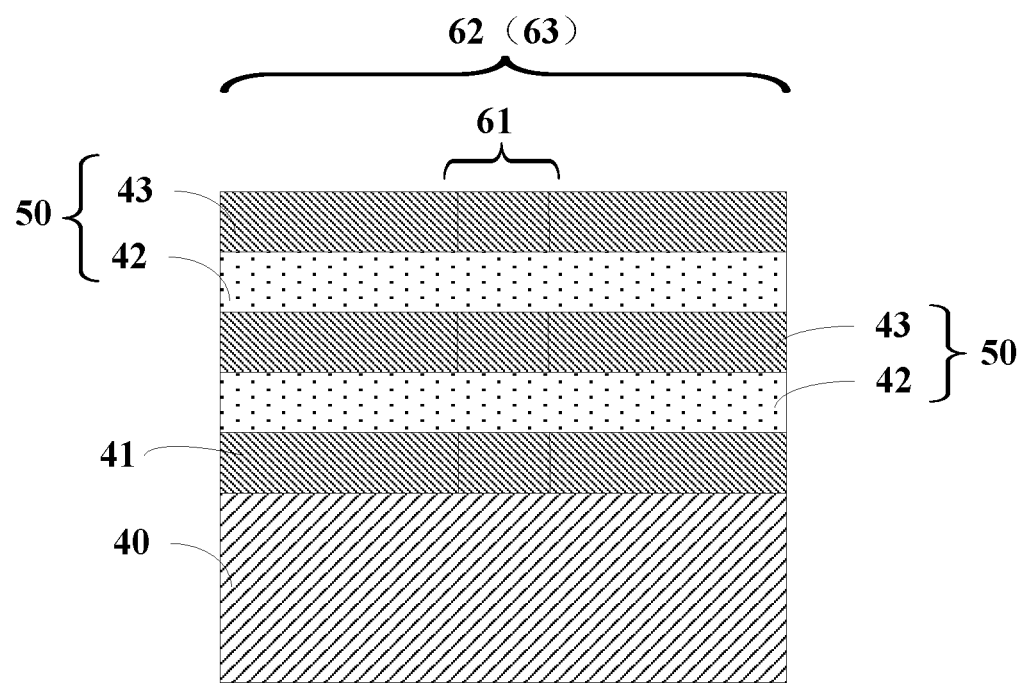
FIG. 8B is a cross-sectional view illustrating an intermediate stage of the semiconductor structure in FIG. 8A taken along the line D-D' in the traverse direction.

FIG. 8A is a cross-sectional view illustrating an intermediate stage of a semiconductor structure in step S404 along the longitudinal direction according to an embodiment of the present disclosure. FIG. 8B is a cross-sectional view illustrating an intermediate stage of the semiconductor structure in FIG. 8A taken along the line D-D' in the traverse direction of FIG. 8A. As shown in FIG. 8A and FIG. 8B, a portion of second semiconductor layer 42 is selectively removed by etching to form an air gap 70 between first semiconductor layer 41 and third semiconductor layer 43 and between two third semiconductor layer 43 in each of the stack of semiconductor layer structures.

In an embodiment, the step of selectively etching includes forming a third patterned mask layer (e.g., photoresist) covering a portion 62 and a portion 63 of the fin structure and removing a portion 61 that is not covered by the third patterned mask layer. In an embodiment, first portion in the second semiconductor layer 62 may be removed using a microwave etching process based on carbon tetrafluoride ($CF_4$). The third patterned mask layer is removed thereafter.

Referring back to FIG. 4, in step S405, the method may include filling the air gaps with an insulator layer.

Figure 9A:
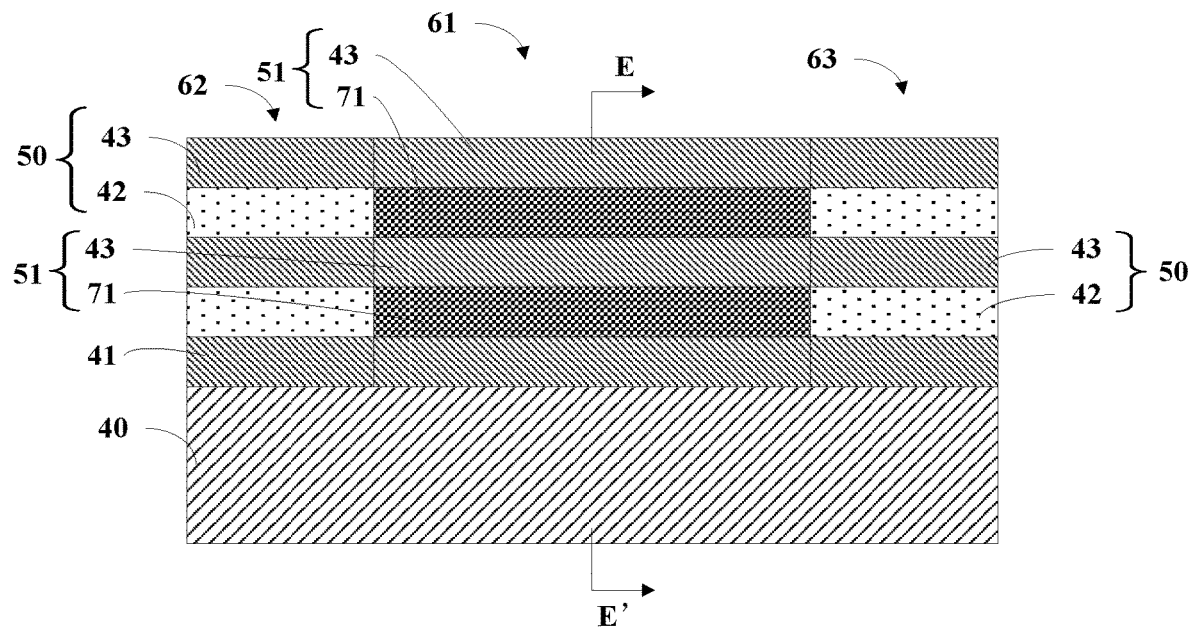
FIG. 9A is a cross-sectional view illustrating an intermediate stage in the manufacturing process of a semiconductor structure taken along the longitudinal direction according to yet another embodiment of the present disclosure.
Figure 9B:
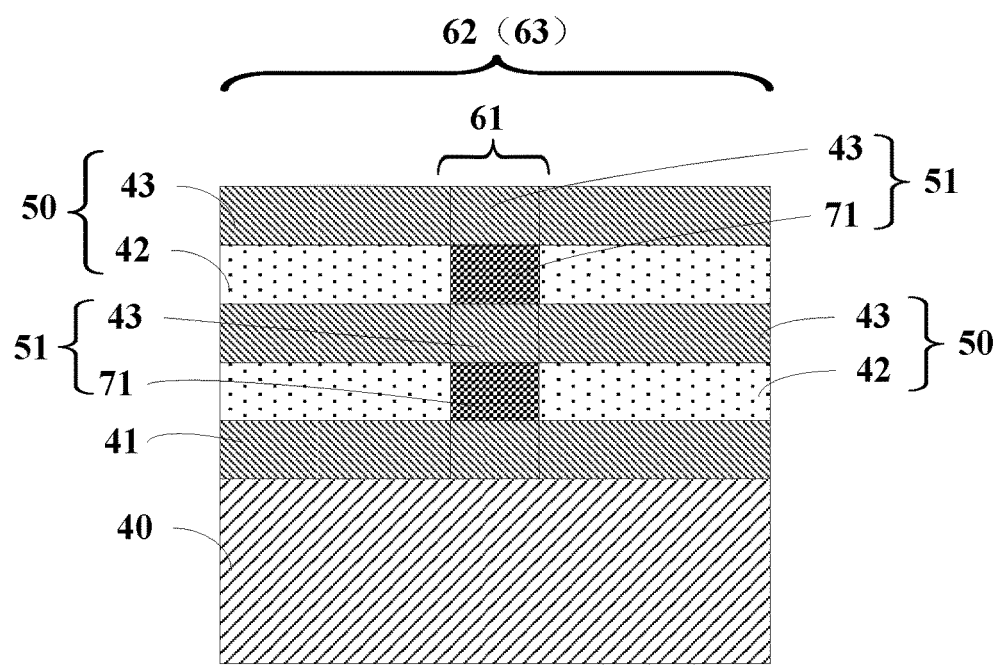
FIG. 9B is a cross-sectional view illustrating an intermediate stage of the semiconductor structure in FIG. 9A taken along the line E-E' in the traverse direction.

FIG. 9A is a cross-sectional view illustrating an intermediate stage of a semiconductor structure in step S405 along the longitudinal direction according to an embodiment of the present disclosure. FIG. 9B is a cross-sectional view illustrating an intermediate stage of the semiconductor structure in FIG. 9A taken along the line E-E' in the traverse direction of FIG. 9A. As shown in FIG. 9A and FIG. 9B, an insulator layer 71 is formed filling air gap 70. The insulator layer may include silicon dioxide.

In an embodiment, the step of forming the insulator layer may include a flowable chemical vapor deposition (FCVD) process covering the air gaps that have been selectively removed by etching. In an embodiment, the step of forming the insulator layer may also include selectively removing a portion of the insulator layer using an etch-back process, while retaining the portion of the insulator layer filling the air gaps.

Thus, the present disclosure provides the description of another method of manufacturing a semiconductor device.

According to the embodiment, as shown in FIG. 9A and FIG. 9B, the semiconductor device includes a substrate and a fin structure on the substrate. In an embodiment, the substrate includes silicon (e.g., undoped silicon or boron doped silicon).

In an embodiment, the fin structure includes first semiconductor layer 41 on semiconductor substrate 40, and a stack of one or more semiconductor layer structures 51 on first semiconductor layer 41. Semiconductor layer structures 51 each may include insulator layer 71 and third semiconductor layer 43 on insulator layer 71. First semiconductor layer 41 includes the same semiconductor compound as that of third insulator layer 43.

In an embodiment, first silicon semiconductor layer 41 includes a germanium tin compound and has a thickness in the range between 5 nm and 50 nm, e.g., 10 nm, 30 nm, etc.

In an embodiment, third silicon semiconductor layer 43 includes a germanium tin compound and has a thickness in the range between 5 nm and 50 nm, e.g., 10 nm, 30 nm, etc.

In an embodiment, insulator layer 71 may include silicon dioxide.

In an embodiment, referring to FIG. 9A, the fin structure may include a first portion 61 disposed in the middle portion of the fin structure, a second portion, and a third portion 63 adjacent to opposite sides of first portion 61 along the longitudinal direction. Second portion 62 and third portion 63 each may include a portion of second semiconductor layer 42 disposed between first semiconductor layer 41 and third semiconductor layer 43 and a portion of second semiconductor layer 42 disposed between two adjacent third semiconductor layers 43 of each of semiconductor layer structures 50. In an embodiment, as shown in FIG. 9B, the dimension of first portion 61 is smaller than the dimension of second portion 62 and smaller than the dimension of third portion 63 in the transverse direction (perpendicular to the longitudinal direction) of FIG. 9A.

In an embodiment, a source and a drain may be formed in third semiconductor layer ($Ge_{1-x}Sn_x$ compound) 43, and a gate on the fin structure to form an NMOS or PMOS device, wherein a portion of the third semiconductor layer between the source and the drain is the channel region of the NMOS or PMOS device. Comparing with conventional fin structures without the insulator layers, the fin structure of the present disclosure includes one or more insulator layers (e.g., insulator layer 71) to achieve a higher on current/off current ratio, thereby improving the device performance.

In an embodiment, prior to forming the fin structure, the method may include forming a second semiconductor layer on the one or more semiconductor layer structures. In an embodiment, etching process a portion of the one or more semiconductor layer structures also includes removing a portion of the second semiconductor layer. In an embodiment, selectively etching also includes the remaining portion of the second semiconductor layer on the one or more semiconductor layer structures.

FIGS. 10A, 10B, 11A, 11B, 12A, 12B, 13A, 13B, 14A, and 14B are cross-sectional views illustrating intermediate stages of a semiconductor structure in different process steps of a method of manufacturing according to yet another embodiment of the present disclosure.

Figure 10A:
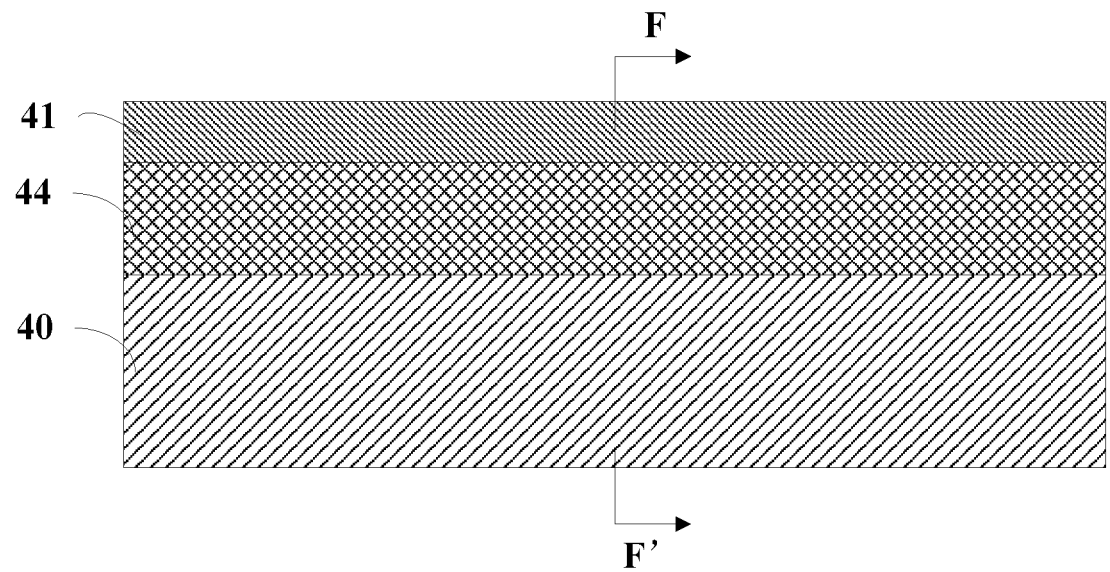
FIG. 10A is a cross-sectional view illustrating an intermediate stage in the manufacturing process of a semiconductor structure taken along the longitudinal direction according to yet another embodiment of the present disclosure.
Figure 10B:
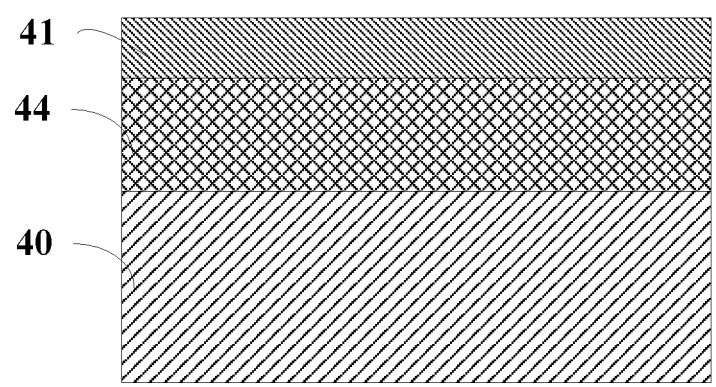
FIG. 10B is a cross-sectional view illustrating an intermediate stage of the semiconductor structure in FIG. 10A taken along the line F-F' in the traverse direction.

First, as shown in FIG. 10A and FIG. 10B, a first semiconductor layer 41 is formed on a substrate. In the embodiment, the substrate includes a semiconductor substrate 40 (e.g., silicon substrate) and a fourth semiconductor layer (silicon germanium) 44 on semiconductor substrate 40. That is, first semiconductor layer 41 is on fourth semiconductor layer 44. In an embodiment, fourth semiconductor layer 44 has a thickness in the range between 5 nm and 50 nm, e.g., 10 nm, 30 nm, etc.

In an embodiment, fourth semiconductor layer 44 may be formed on semiconductor substrate 40 using an epitaxial growth process. In an embodiment, first semiconductor layer 41 may be formed on fourth semiconductor layer 44 using an epitaxial growth process.

Figure 11A:
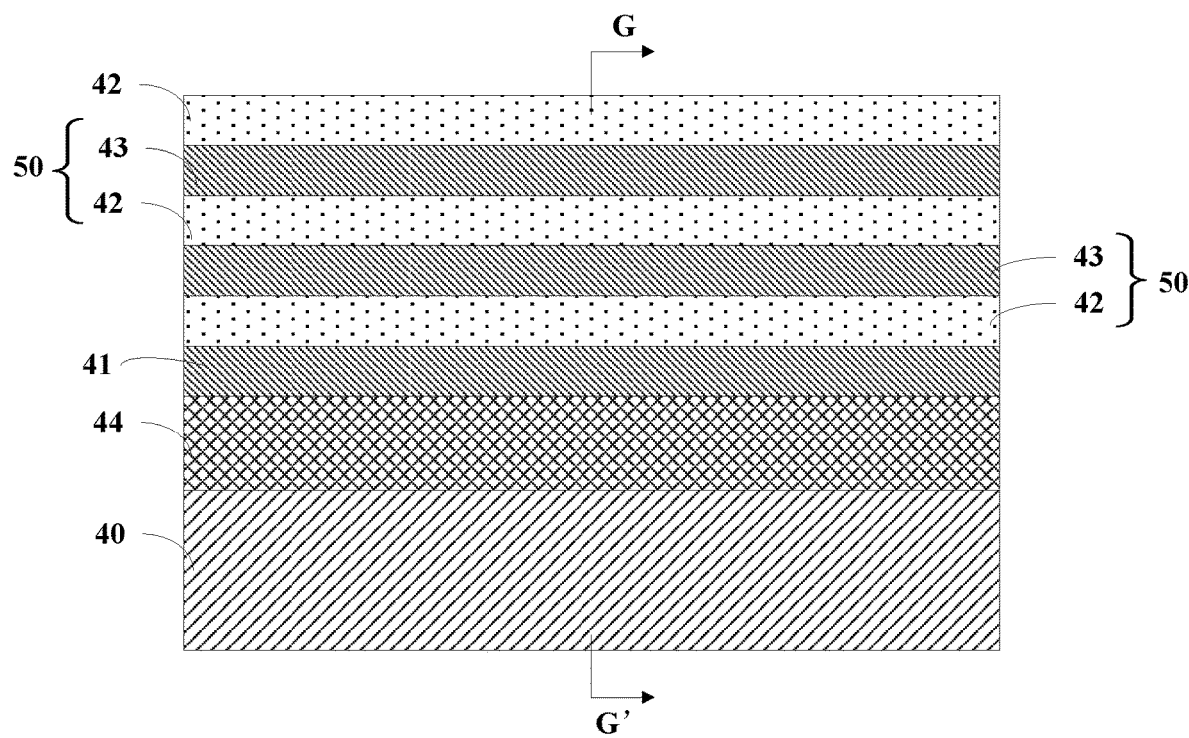
FIG. 11A is a cross-sectional view illustrating an intermediate stage in the manufacturing process of a semiconductor structure taken along the longitudinal direction according to yet another embodiment of the present disclosure.
Figure 11B:
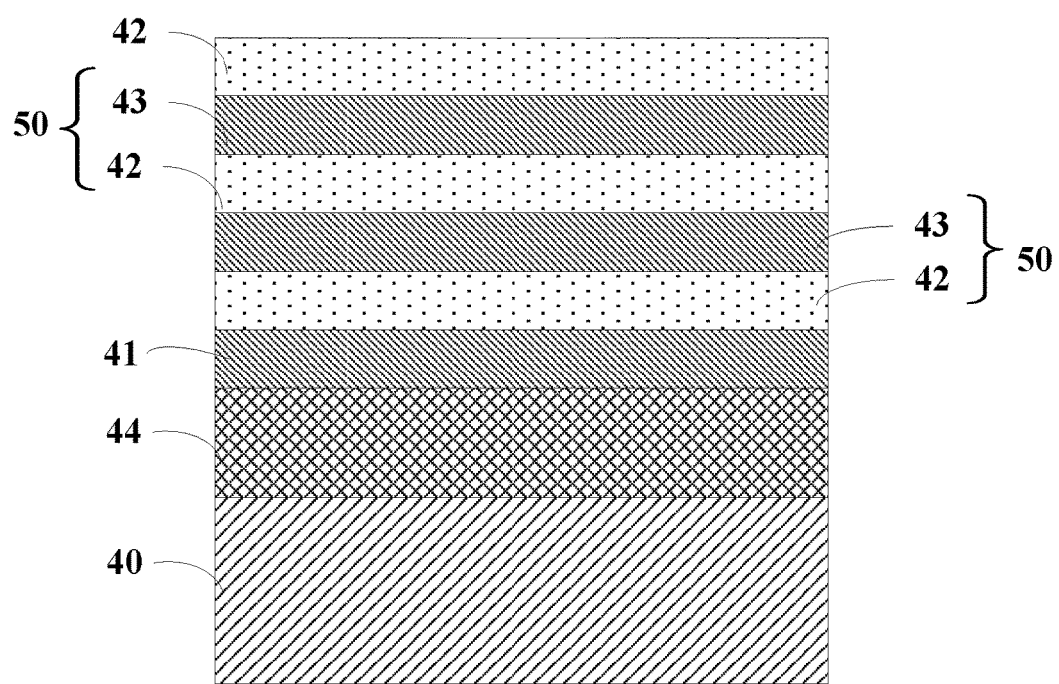
FIG. 11B is a cross-sectional view illustrating an intermediate stage of the semiconductor structure in FIG. 11A taken along the line G-G' in the traverse direction.

Next, as shown in FIGS. 11A and 11B, a stack of one or more semiconductor layer structures 50 may be formed on first semiconductor layer 41. A semiconductor layer structure 50 is firstly formed on the first semiconductor layer and includes a second semiconductor layer (e.g., germanium) 42 and a third semiconductor layer (e.g., germanium tin) 43 on second semiconductor layer 42. Second semiconductor layer 42 includes at least one common compound element as that of third semiconductor layer 43. First semiconductor layer 41 includes the same semiconductor compound as that of third semiconductor layer 43.

Next, referring still to FIGS. 11A and 11B, a second semiconductor layer (e.g., germanium) 42 of a subsequent semiconductor layer structure is formed on the current semiconductor layer structure using an epitaxial growth process. Thereafter, a third semiconductor layer (e.g., germanium tin) 43 is formed on the second semiconductor layer, and the process repeats to form subsequent semiconductor layer structures.

Figure 12A:
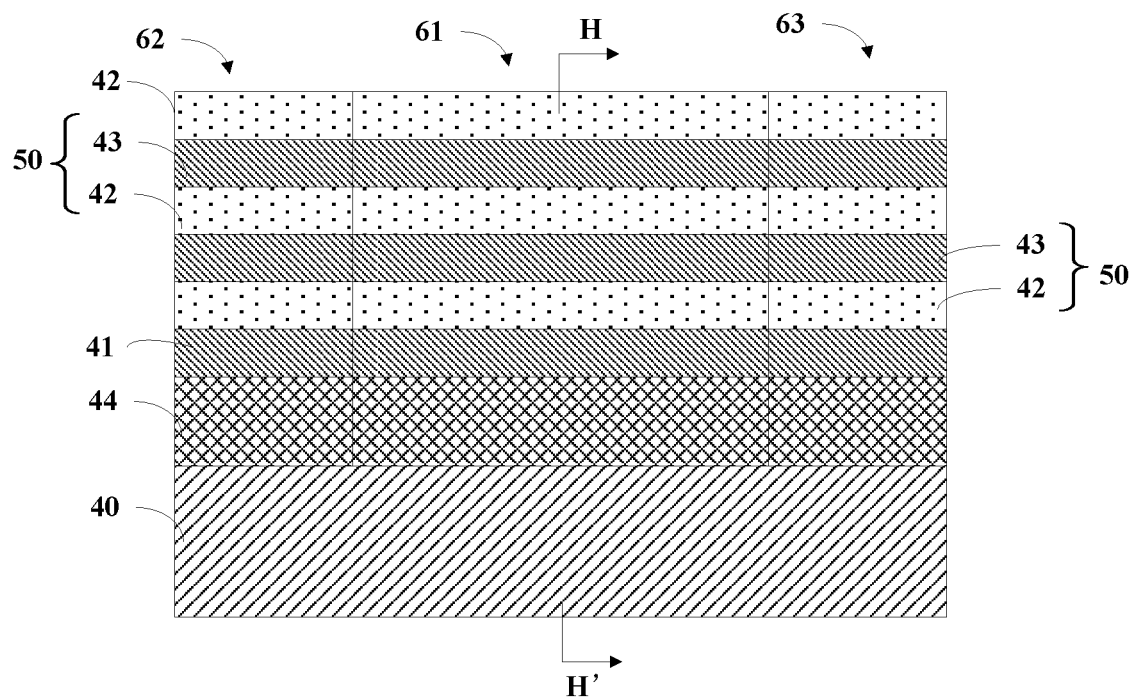
FIG. 12A is a cross-sectional view illustrating an intermediate stage in the manufacturing process of a semiconductor structure taken along the longitudinal direction according to yet another embodiment of the present disclosure.
Figure 12B:
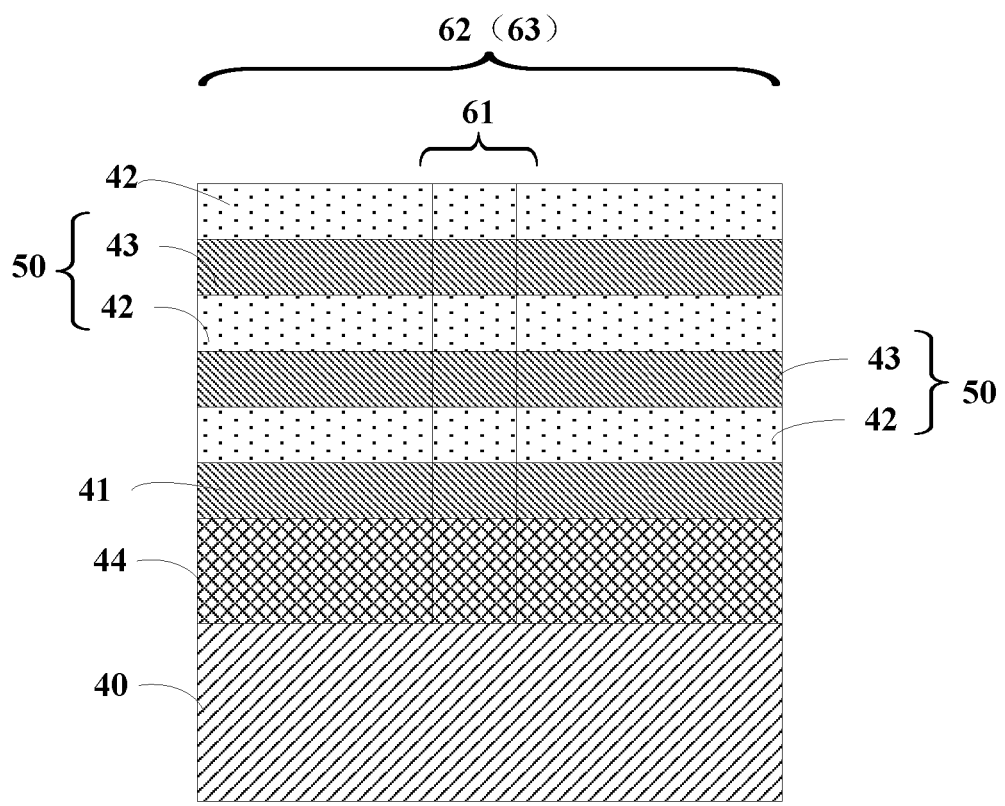
FIG. 12B is a cross-sectional view illustrating an intermediate stage of the semiconductor structure in FIG. 12A taken along the line H-H' in the traverse direction.

Next, referring to FIGS. 12A and 12B, an etching process is performing on second semiconductor layers 42 in the stack of semiconductor layer structures 50, semiconductor layer structures 50, first semiconductor layer 41, and fourth semiconductor layer 44 to form a fin structure. The fin structure may include a first portion 61 in the middle portion of the fin structure and a second portion 62 and a third portion 63 disposed on opposite sides of first portion 61 along the longitudinal direction.

Figure 13A:
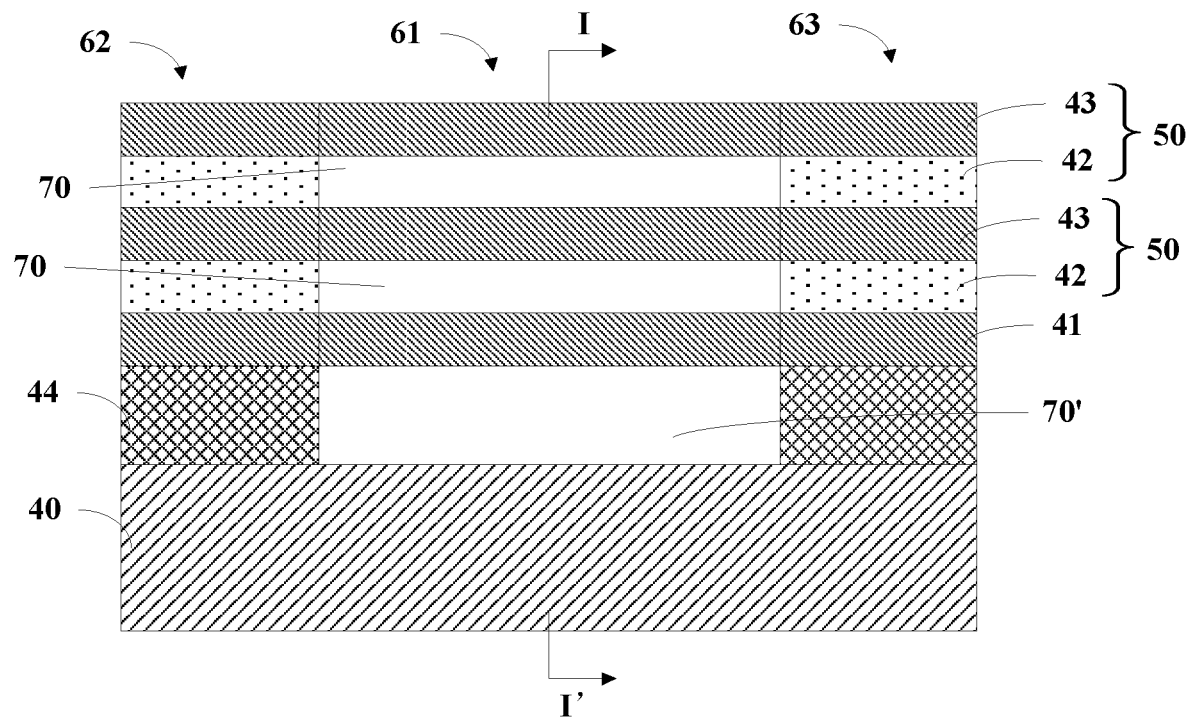
FIG. 13A is a cross-sectional view illustrating an intermediate stage in the manufacturing process of a semiconductor structure taken along the longitudinal direction according to yet another embodiment of the present disclosure.
Figure 13B:
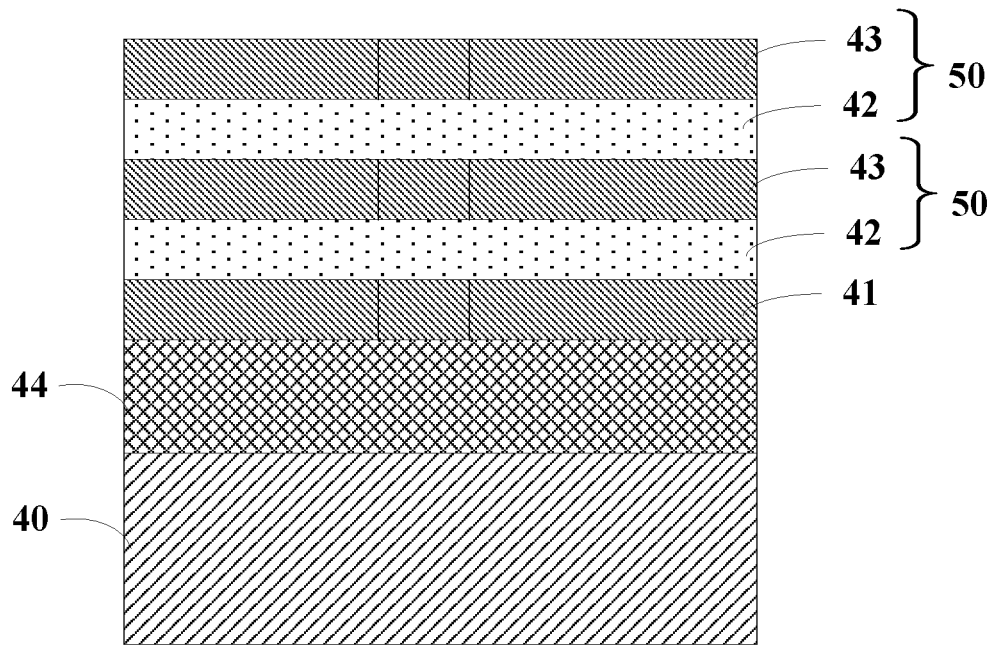
FIG. 13B is a cross-sectional view illustrating an intermediate stage of the semiconductor structure in FIG. 13A taken along the line I-I' in the traverse direction.

Next, referring to FIGS. 13A and 13B, portions of second semiconductor layers 42 of the fin structure are selectively removed to form an air gap 70 in the second semiconductor layer between first semiconductor layer 41 and third semiconductor layer 43 and in the second semiconductor layers between two adjacent third semiconductor layers 43 in the semiconductor layer structures.

In an embodiment, the selective etching process step also removes a portion of fourth semiconductor layer 44 (e.g., the portion of the fourth semiconductor layer disposed in portion 61) to form an air gap 70' between semiconductor substrate 40 and first semiconductor layer 41.

In an embodiment, the selective etching process step also removes portions 61 of second semiconductor layers 42 of the stack of one or more semiconductor layer structures to form air gaps in the second semiconductor layers.

Figure 14A:
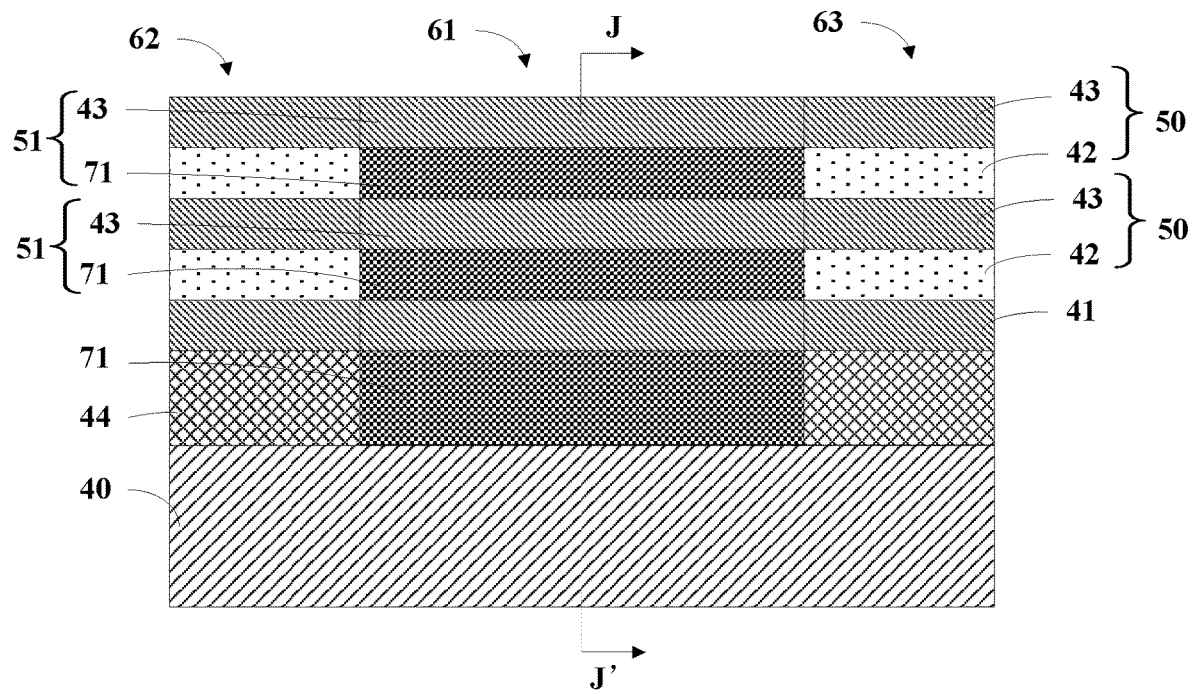
FIG. 14A is a cross-sectional view illustrating an intermediate stage in the manufacturing process of a semiconductor structure taken along the longitudinal direction according to yet another embodiment of the present disclosure.
Figure 14B:
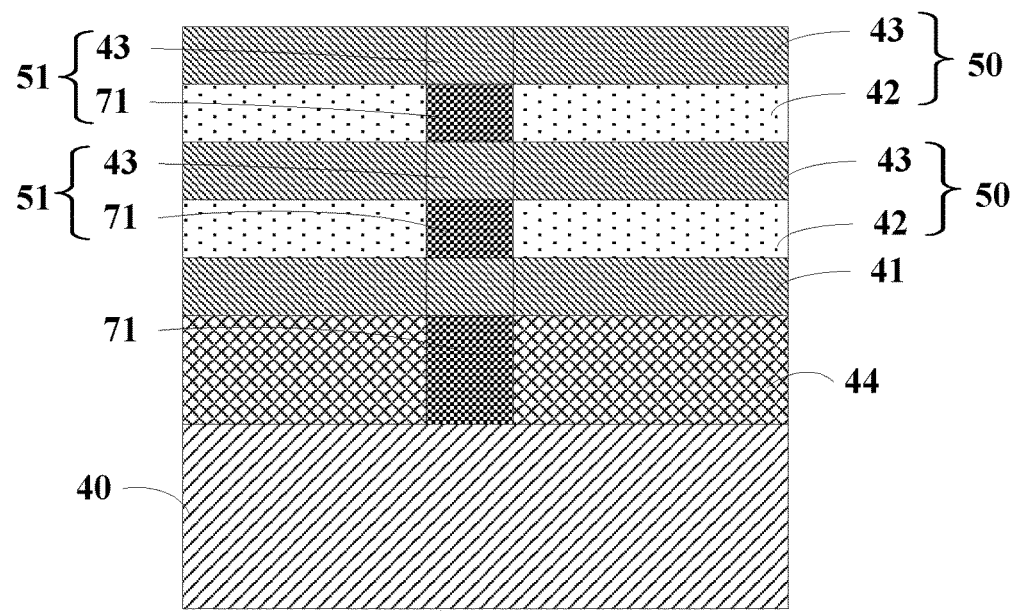
FIG. 14B is a cross-sectional view illustrating an intermediate stage of the semiconductor structure in FIG. 14A taken along the line J-J' in the traverse direction.

Next, referring to FIGS. 14A and 14B, an insulator layer 71 is formed filling air gaps 70 and 70'.

In summary, a semiconductor device is thus provided by yet another manufacturing method according to the present disclosure. Referring to FIGS. 14A and 14B, the semiconductor device may include a substrate and a fin structure on the substrate. In an embodiment, the substrate may include a semiconductor substrate 40 and a fourth semiconductor layer 44 on semiconductor substrate 40. In an embodiment, fourth semiconductor layer 44 includes SiGe and has a thickness in the range between 5 nm and 50 nm, e.g., 10 nm, 30 nm, etc.

In an embodiment, the fin structure includes a first semiconductor layer 41 on fourth semiconductor layer 44 and a stack of one or more semiconductor layer structures 51 on first semiconductor layer 41. Semiconductor layer structures 51 each may include an insulator layer 71 and a third semiconductor layer 43 on insulator layer 71. First semiconductor layer 41 includes the same semiconductor compound as that of third semiconductor layer 43. In an embodiment, referring to FIG. 14A, an insulator layer 71 may also be formed between semiconductor substrate 40 and first semiconductor layer 41.

In another embodiment, a source and a drain may be formed in third semiconductor layer (e.g., germanium tin) 43, a gate may be formed on the fin structure to form an NMOS device or a PMOS device having a portion of the third semiconductor layer between the source and the drain as a channel region. Comparing with conventional fin structures without the insulator layers, the fin structure of the present disclosure includes one or more insulator layers (e.g., insulator layer 71) to achieve a higher on current/off current ratio, thereby improving the device performance.

Thus, embodiments of the present disclosure provide a detailed description of a method of manufacturing a semiconductor device and a semiconductor device manufactured by the described method. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:

1. A semiconductor device, comprising:
    a substrate; and
    a fin structure comprising:
      a first semiconductor layer on the substrate;
      a stack of one or more semiconductor layer structures, each of the semiconductor layer structures comprising a first insulator layer and a second semiconductor layer on the first insulator layer, the first and second semiconductor layers having a same semiconductor compound;
      a source and a drain in the second semiconductor layer; and
      a gate on the fin structure.

2. The semiconductor device of claim 1, wherein each of the semiconductor layer structures further comprises:
    a third semiconductor layer below the first insulator layer, so that the first insulator layer is between the third semiconductor layer and the second semiconductor layer, the third semiconductor layer and the second semiconductor layer comprising at least one common compound element.

3. The semiconductor device of claim 2, wherein the third semiconductor layer comprises InP.

4. The semiconductor device of claim 2, wherein the third semiconductor layer and the second semiconductor layer each comprise a group III-V compound.

5. The semiconductor device of claim 2, wherein the second semiconductor layer comprises a compound with three elements, and the third semiconductor layer comprises a compound with two elements.

6. The semiconductor device of claim 2, wherein the second semiconductor layer comprises InGaAs, and the third semiconductor layer comprises InP.

7. The semiconductor device of claim 1, wherein the substrate comprises a trench on opposite sides of the fin structure, the trench being filled with an insulator layer.

8. The semiconductor device of claim 1, wherein the substrate comprises a fourth semiconductor layer, and the first semiconductor layer is on the fourth semiconductor layer.

9. The semiconductor device of claim 8, wherein the fourth semiconductor layer comprises InAlAs.

10. The semiconductor device of claim 1, wherein each of the first and second semiconductor layers comprise InGaAs, and the first insulator layer comprises a high-k dielectric material.

11. The semiconductor device of claim 1, wherein the substrate comprises silicon, and the first semiconductor layer comprises a compound with three elements.

12. A semiconductor device, comprising:
    a substrate; and
    a fin structure comprising:
      a first semiconductor layer on the substrate; and
      a stack of one or more semiconductor layer structures, each of the semiconductor layer structures comprising an epitaxially grown second semiconductor layer and an epitaxially grown third semiconductor layer on the epitaxially grown second semiconductor layer, the first semiconductor layer and the third epitaxially grown semiconductor layers having a same semiconductor compound.

13. The semiconductor device of claim 12, wherein the substrate comprises a fourth semiconductor layer, and the first semiconductor layer is on the fourth semiconductor layer.

14. The semiconductor device of claim 13, wherein the substrate comprises silicon, the fourth semiconductor layer comprises silicon germanium, and the first semiconductor layer is an epitaxially grown semiconductor layer.

15. The semiconductor device of claim 12, wherein:
    the first semiconductor layer comprises germanium tin; and
    the epitaxially grown third semiconductor layer comprises germanium tin.

16. The semiconductor device of claim 12, wherein the epitaxially grown second semiconductor layer and the epitaxially grown third semiconductor layer comprise at least one common compound element.

17. The semiconductor device of claim 12, wherein the fin structure comprises:

a first portion disposed in a middle portion of the fin structure and having an insulator layer and the epitaxially grown third semiconductor layer on the insulator layer;

second and third portions on opposite sides of the first portion and each having the epitaxially grown second semiconductor layer adjacent the insulator layer.

18. The semiconductor device of claim 17, wherein the insulator layer comprise silicon dioxide.

19. The semiconductor device of claim 12, wherein the fin structure comprises:

a source and a drain in the epitaxially grown third semiconductor layer; and a gate on the fin structure.

* * * * *